US012696743B2

(12) United States Patent
Tahara et al.

(10) Patent No.: US 12,696,743 B2
(45) Date of Patent: Jul. 28, 2026

(54) SUBSTRATE PROCESSING METHOD

(71) Applicant: SCREEN Holdings Co., Ltd., Kyoto (JP)

(72) Inventors: Kana Tahara, Kyoto (JP); Masaki Inaba, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 256 days.

(21) Appl. No.: 18/711,590

(22) PCT Filed: Sep. 16, 2022

(86) PCT No.: PCT/JP2022/034755
§ 371 (c)(1),
(2) Date: May 18, 2024

(87) PCT Pub. No.: WO2023/089939
PCT Pub. Date: May 25, 2023

(65) Prior Publication Data
US 2025/0014944 A1 Jan. 9, 2025

(30) Foreign Application Priority Data
Nov. 19, 2021 (JP) ................................. 2021-188917

(51) Int. Cl.
H10W 20/00 (2026.01)
H10P 95/00 (2026.01)

(52) U.S. Cl.
CPC ........... H10W 20/062 (2026.01); H10P 95/04 (2026.01)

(58) Field of Classification Search
CPC ...... H10W 20/062; H10P 95/04; H10P 50/00; H10P 52/00; H10P 70/20
See application file for complete search history.

(56) References Cited

U.S. PATENT DOCUMENTS 6,228,753 B1 * 5/2001 Lo ....................... H10W 72/012
438/106
10,612,152 B2 * 4/2020 Xu ............................ C25F 3/02
(Continued)

FOREIGN PATENT DOCUMENTS

JP 3-297141 A 12/1991
JP 7-135178 A 5/1995
(Continued)

OTHER PUBLICATIONS

JP-2020127907-A, Machine Translation (Year: 2026).*
(Continued)

*Primary Examiner* — Joshua L Allen
*Assistant Examiner* — Christopher Remavege
(74) *Attorney, Agent, or Firm* — OSTROLENK FABER LLP

(57) ABSTRACT

An etching liquid is supplied to a principal surface of a substrate that has the principal surface on which a processing object layer having a plurality of crystal grains is exposed (first etching step). A polymer-containing liquid containing a polymer is supplied to the principal surface of the substrate after the first etching step, and a polymer layer at least portion of which is embedded in a crystal grain boundary which is a boundary of the crystal grains is formed (polymer layer forming step). The processing object layer is etched by supplying an etching liquid to the principal surface of the substrate after the polymer layer forming step (second etching step).

10 Claims, 14 Drawing Sheets

(56)         References Cited

U.S. PATENT DOCUMENTS

| | | | |
|---|---|---|---|
| 2003/0124747 | A1 | 7/2003 | Oh et al. |
| 2006/0193889 | A1* | 8/2006 | Spradlin ................. A61F 2/915 |
| | | | 607/86 |
| 2007/0072413 | A1* | 3/2007 | Choi ................... H10W 20/062 |
| | | | 438/645 |
| 2019/0003062 | A1 | 1/2019 | Matsumoto |
| 2019/0258166 | A1 | 8/2019 | Otsuji |
| 2020/0168467 | A1 | 5/2020 | Higuchi et al. |
| 2021/0210689 | A1* | 7/2021 | Wu .................... C09K 11/0833 |
| 2021/0323061 | A1* | 10/2021 | Kunimune ........... B32B 15/046 |

FOREIGN PATENT DOCUMENTS

| | | | | | |
|---|---|---|---|---|---|
| JP | 2001298218 | A | * | 10/2001 | |
| JP | 2003-282737 | A | | 10/2003 | |
| JP | 2014096498 | A | * | 5/2014 | |
| JP | 2017-150069 | A | | 8/2017 | |
| JP | 2018-043173 | A | | 3/2018 | |
| JP | 2018-043176 | A | | 3/2018 | |
| JP | 2019-61978 | A | | 4/2019 | |
| JP | 2020-088178 | A | | 6/2020 | |
| JP | 2020127907 | A | * | 8/2020 | |
| KR | 19990065086 | A | * | 8/1999 | ......... H10W 20/035 |

OTHER PUBLICATIONS

JP-2001298218-A, Machine Translation. (Year: 2027).*
JP-2014096498-A, Machine Translation. (Year: 2026).*
KR-19990065086-A, Machine Translation. (Year: 2026).*
International Search Report mailed Oct. 18, 2022 in corresponding PCT International Application No. PCT/JP2022/034755.
Written Opinion mailed Oct. 18, 2022 in corresponding PCT International Application No. PCT/JP2022/034755.
International Preliminary Report on Patentability (Chapter 1) with Notification from the International Bureau (Form PCT/IB/326) mailed May 30, 2024 in corresponding International Application No. PCT/JP2022/034755.
English translation of the International Preliminary Report on Patentability (Chapter 1) with Notification from the International Bureau (Form PCT/IB/338) mailed May 30, 2024 in corresponding International Application No. PCT/JP2022/034755.

* cited by examiner

SUBSTRATE PROCESSING METHOD

CROSS-REFERENCE TO RELATED APPLICATIONS

The present application is a 35 U.S.C. §§ 371 national stage application of International Application No. PCT/JP2022/034755 filed Sep. 16, 2022, which claims priority to Japanese Patent Application No. 2021-188917, filed Nov. 19, 2021, the contents of which are incorporated herein by reference.

TECHNICAL FIELD

The present invention relates to a substrate processing method that processes a substrate.

A substrate to be processed includes, for example, a semiconductor wafer, a substrate for a flat panel display (FPD) such as a liquid crystal display and an organic electroluminescence (EL) display, a substrate for an optical disc, a substrate for a magnetic disk, a substrate for a magneto-optical disc, a substrate for a photomask, a ceramic substrate, and a substrate for a solar cell, etc.

BACKGROUND ART

Patent Literatures 1 and 2 below disclose a plurality of alternate executions of an oxidized metal layer forming step and an oxidized metal layer removing step.

CITATION LIST

Patent Literature

Patent Literature 1: Japanese Patent Application Publication No. 2019-61978
Patent Literature 2: Japanese Patent Application Publication No. 2020-88178

SUMMARY OF INVENTION

Technical Problem

In a substrate processing method disclosed in Patent Literature 1, by forming an oxidized metal layer by oxidizing a surface layer portion of a metal layer and removing the oxidized metal layer, etching of the metal layer with the precision of nanometers or less is achieved. Patent Literature 1 discloses that, by repeating formation of the oxidized metal layer and removal of the oxidized metal layer, a desired etching amount is achieved in the substrate processing method.

Patent Literature 2 discloses that, in a substrate processing method of repeating formation of an oxidized metal layer and removal of the oxidized metal layer, in order to reduce a difference between etching rate with respect to crystal grains and etching rate with respect to a crystal grain boundary, an etching liquid having a compound that has a larger size than a clearance existing in the crystal grain boundary as a reaction compound is used.

An embodiment of the present invention provides a substrate processing method capable of reducing roughness of a front surface (front surface roughness) of a processing object layer due to a difference between etching rate with respect to crystal grains and etching rate with respect to a crystal grain boundary.

Solution to Problem

An embodiment of the present invention provides a substrate processing method, including a first etching step of supplying an etching liquid to a principal surface of a substrate that has the principal surface on which a processing object layer having a plurality of crystal grains is exposed, a polymer layer forming step of supplying a polymer-containing liquid containing a polymer to the principal surface of the substrate after the first etching step, and forming a polymer layer at least portion of which is embedded in a crystal grain boundary which is a boundary of the crystal grains, and a second etching step of supplying an etching liquid to the principal surface of the substrate after the polymer layer forming step, and etching the processing object layer.

According to this method, the processing object layer having the plurality of crystal grains is exposed from the principal surface of the substrate to which the etching liquid is supplied in the first etching step. The etching liquid more easily permeates the crystal grain boundary than the crystal grains. Therefore, etching rate with respect to the crystal grain boundary is higher than etching rate with respect to the crystal grains. Thus, by the first etching step, etching with respect to the crystal grain boundary progresses more swiftly than etching with respect to the crystal grains, and a recess portion is formed in the crystal grain boundary (recess portion forming step).

Thereafter, it is possible to embed at least portion of the polymer layer in the crystal grain boundary in the polymer layer forming step. After the polymer layer forming step, by supplying the etching liquid to the principal surface of the substrate, it is possible to etch the processing object layer (second etching step).

At the time of supplying the etching liquid to the principal surface of the substrate in the second etching step, the polymer layer is embedded in the crystal grain boundary. Therefore, it is possible to suppress the etching liquid from entering the crystal grain boundary. It is thereby possible to suppress variation of the etching rate due to the entry of the etching liquid to the crystal grain boundary.

As a result, it is possible to reduce roughness of a front surface of the processing object layer due to a difference between the etching rate with respect to the crystal grains and the etching rate with respect to the crystal grain boundary.

In an embodiment of the present invention, the polymer layer forming step includes a step of forming a first polymer layer on the processing object layer, and forming a second polymer layer embedded in the crystal grain boundary. According to this method, there is no need to supply the polymer-containing liquid to the principal surface of the substrate so that the polymer layer is not formed on the processing object layer and the polymer layer is formed only in the crystal grain boundary. Therefore, it is possible to increase the degree of freedom of a method of supplying the polymer-containing liquid.

In an embodiment of the present invention, the substrate processing method further includes a first removing liquid supplying step of supplying a first removing liquid that removes the first polymer layer to the principal surface of the substrate after the polymer layer forming step and before the second etching step.

According to this method, it is possible to remove the first polymer layer with the first removing liquid and remove the first polymer layer from the principal surface of the substrate before the second etching step. By doing so, even in a case where the polymer layer is not sufficiently removed with the etching liquid, it is possible to expose the processing object layer at the time of starting the second etching step. Therefore, it is possible to swiftly etch the processing object layer in the second etching step.

In an embodiment of the present invention, the polymer layer forming step includes a step of forming the polymer layer embedded in the crystal grain boundary so that a front surface of the processing object layer is exposed.

According to this method, without removing the polymer layer from the front surface of the processing object layer, it is possible to start etching the processing object layer with the etching liquid. Therefore, it is possible to shorten the time required for completing substrate processing.

In an embodiment of the present invention, the second etching step includes a step of etching the processing object layer with the etching liquid and also dissolving the polymer layer in the etching liquid.

According to this method, with the etching liquid, it is possible to etch the processing object layer and also remove the polymer layer embedded in the crystal grain boundary. Therefore, without removing the polymer layer by a method different from supply of the etching liquid after the processing object layer is removed, it is possible to reduce the roughness of the principal surface of the processing object layer.

In an embodiment of the present invention, the substrate processing method further includes a second removing liquid supplying supplying a second removing liquid that removes the polymer layer from the principal surface of the substrate after the second etching step.

According to this method, it is possible to remove the polymer layer remaining on the front surface of the processing object layer after the processing object layer is etched. Therefore, it is possible to reduce the roughness of the front surface of the processing object layer.

In an embodiment of the present invention, cycle processing having the first etching step, the polymer layer forming step, and the second etching step as one cycle is further executed once or more after the second etching step.

According to this method, the cycle processing including the first etching step, the polymer layer forming step, and the second etching step is repeated. Therefore, even when a thickness of the processing object layer etched by executing the first etching step, the polymer layer forming step, and the second etching step once each is insufficient, it is possible to achieve a desired etching amount by executing the cycle processing multiple times. Therefore, while reducing the roughness of the front surface of the processing object layer due to the difference between the etching rate with respect to the crystal grains and the etching rate with respect to the crystal grain boundary, it is possible to achieve the desired etching amount.

In an embodiment of the present invention, the substrate processing method may further include a first rinsing step of supplying a rinsing liquid to the principal surface of the substrate after the first etching step and before the polymer layer forming step. In an embodiment of the present invention, the substrate processing method may further include a second rinsing step of supplying the rinsing liquid to the principal surface of the substrate after the second etching step.

The above or yet other objects, characteristics, and effects of the present invention will be clarified by the following description of an embodiment made with reference to the attached drawings.

4

DESCRIPTION OF EMBODIMENTS

<Arrangement of Substrate Processing Apparatus>

Figure 1:
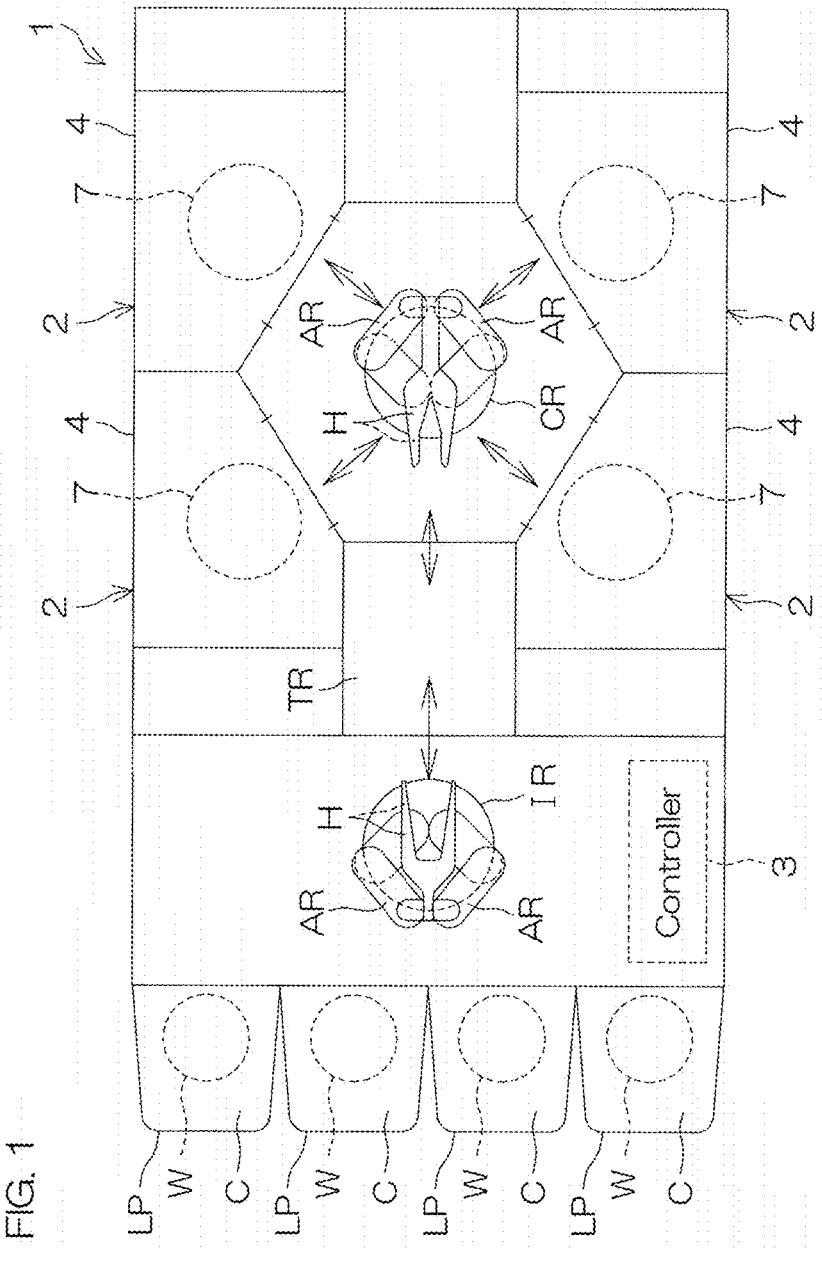
FIG. 1 is an illustrative plan view showing a layout of a substrate processing apparatus according to an embodiment of the present invention.

FIG. 1 is an illustrative plan view showing a layout of a substrate processing apparatus 1 according to an embodiment of the present invention.

The substrate processing apparatus 1 is a single substrate processing type apparatus that processes substrates W one by one. In the embodiment, the substrates W have a circular shape.

The substrate processing apparatus 1 includes a plurality of processing units 2 that process the substrates W, load ports LP on which carriers C that house the plurality of the substrates W to be processed are mounted, transfer robots IR and CR that transfer the substrates W between the load ports LP and the processing units 2, and a controller 3 that controls the substrate processing apparatus 1.

The transfer robot IR transfers the substrates W between the carriers C and the transfer robot CR. The transfer robot CR transfers the substrates W between the transfer robot IR and the processing units 2.

Each of the transfer robots IR and CR is a multi-joint arm robot including a pair of multi-joint arms AR, and a pair of hands H respectively provided in leading ends of the pair of multi-joint arms AR so that the hands H are separated from each other in the up/down direction.

The plurality of processing units 2 form four processing towers respectively disposed at four positions that are horizontally separate from each other. Each of the processing towers includes the plurality of processing units 2 stacked in the up/down direction. Two each of the four processing towers are disposed on both sides of a transfer route TR extending from the load ports LP to the transfer robots IR and CR.

The processing unit 2 is a wet processing unit that processes the substrate W with a liquid. The plurality of processing units 2 have, for example, the same arrangement. The processing liquid includes an etching liquid, a rinsing liquid, a polymer-containing liquid, a first removing liquid, and a second removing liquid, etc., to be described later. The processing unit 2 includes a chamber 4 and a processing cup 7 disposed in the chamber 4, and executes processing to the substrate W in the processing cup 7.

An inlet/outlet (not shown) for carrying in the substrate W and carrying out the substrate W by the transfer robot CR is formed in the chamber 4. A shutter unit (not shown) that opens and closes the inlet/outlet is provided in the chamber 4.

<Arrangement of Surface Layer Portion of Principal Surface of Substrate>

Figure 2:
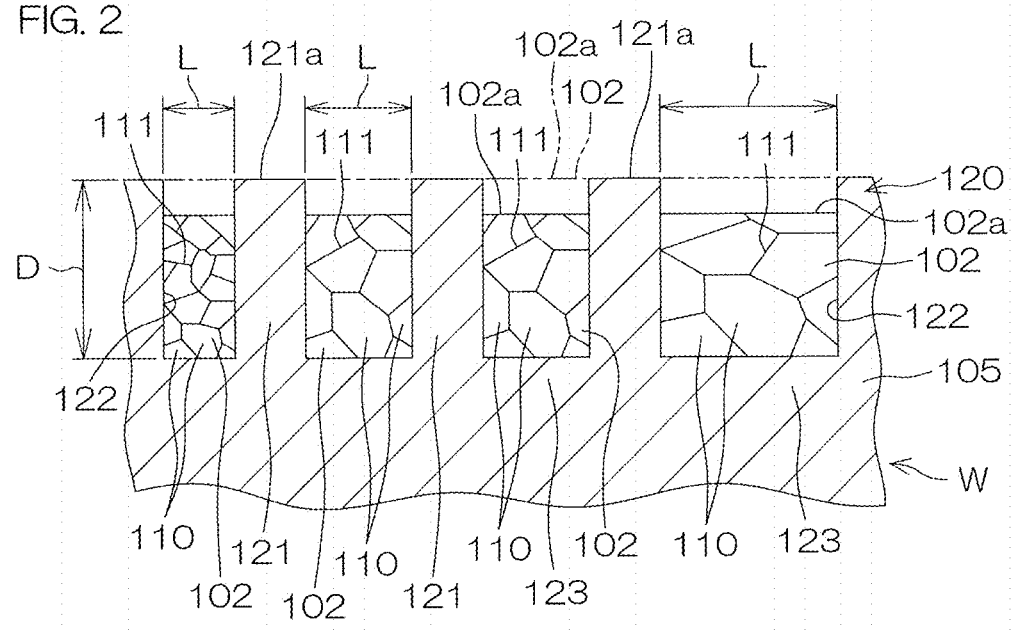
FIG. 2 is a schematic view for describing an example of a structure of a surface layer portion of an upper surface of a substrate to be processed by the substrate processing apparatus.

FIG. 2 is a schematic view for describing an example of a structure of a surface layer portion of a principal surface of the substrate W to be processed by the substrate processing apparatus 1.

The substrate W is a substrate such as a silicon wafer and has a pair of principal surfaces. At least one of the pair of principal surfaces is a device surface where a bump-and-dent pattern 120 is formed. One of the pair of principal surfaces may be a non-device surface where no device is formed.

A foundation layer 105 where a plurality of trenches 122 are formed, and a processing object layer 102 formed in each of the trenches 122 so that a front surface is exposed are formed in the surface layer portion of the device surface. The foundation layer 105 has minute bump-shaped structures 121 placed between the adjacent trenches 122, and a bottom partition portion 123 that partitions a bottom portion of the trench 122. The bump-and-dent pattern 120 is arranged by the plurality of structures 121 and the plurality of trenches 122. A front surface 102a of the processing object layer 102 and a front surface of the foundation layer 105 (structures 121) arrange at least portion of the principal surface of the substrate W.

As shown by a solid line in FIG. 2, the front surface 102a of the processing object layer 102 may be placed at a position closer to the bottom portion of the trench 122 in comparison to a leading end surface 121a of the structure 121 but may not necessarily be so. For example, as shown by an alternate long and two short dashed line in FIG. 2, the front surface 102a of the processing object layer 102 and the leading end surface 121a of the structure 121 may be formed to be flush with each other, and the front surface 102a of the processing object layer 102 and the leading end surface 121a of the structure 121 may arrange a flat surface.

The foundation layer 105 is, for example, an insulating layer or a low dielectric constant layer. The low dielectric constant layer consists of a low dielectric constant (Low-k) material which is a material whose dielectric constant is lower than silicon oxide. Specifically, the low dielectric constant layer may consist of an insulating material in which carbon is added to silicon oxide (SiOC). The insulating layer may contain, for example, at least any of silicon oxide ($SiO_2$) and silicon nitride (SiN). The foundation layer 105 may have a single layer structure or may have a laminated structure. The laminated structure may be arranged by at least any of a semiconductor layer, an insulator layer, or a metal layer.

The trench 122 is formed in, for example, a line shape. A width L of the line-shaped trench 122 is a size of the trench 122 in the direction orthogonal to the direction in which the trench 122 extends.

All of the widths L of the plurality of trenches 122 are not necessarily the same but the trenches 122 having at least two or more widths L may be formed in the vicinity of the surface layer portion of the substrate W. The width L is also a width of the processing object layer 102. The width L of the trench 122 is, for example, not less than 20 nm and not more than 500 nm. A depth D of the trench 122 is a size of the trench 122, and for example, not more than 200 nm.

The depth direction of the trench 122 is, for example, the thickness direction of the substrate W, or the direction orthogonal to the thickness direction of the substrate W. In a case where the trench 122 is formed on a plane orthogonal to the thickness direction of the substrate W (plane parallel to the principal surface), the depth direction of the trench 122 is the thickness direction of the substrate W. In a case where the trench 122 is formed on a side wall of another trench, the side wall being along the thickness direction of the substrate W, the width direction of the trench 122 can be the thickness direction of the substrate W, and the depth direction of the trench 122 can be the direction orthogonal to the thickness direction of the substrate W.

The trench 122 is not restricted to a line shape. In a case where the trench 122 is formed in a circular shape when seen from the depth direction of the trench 122, the width L corresponds to a diameter of the trench 122.

The processing object layer 102 is, for example, a metal layer, and typically, a copper layer (copper wiring). The metal layer is formed on, for example, a front surface of a semiconductor wafer in a Back End of the Line (BEOL) process of a manufacturing process of a semiconductor apparatus, etc. The metal layer is formed, for example, by having a seed layer (not shown) formed in the trench 122 by a method such as sputtering as a core and by crystal growth by an electroplating technology, etc. A method of forming the metal layer is not restricted to this method. The metal layer may be formed only by sputtering, or may be formed by other methods. The metal layer is not restricted to a copper layer. For example, the metal layer may be a metal layer consisting of copper, chromium (Cr), or ruthenium (Ru).

Although not shown, a barrier layer and a liner layer may be provided between the processing object layer 102 and the foundation layer 105 in the trench 122. The barrier layer is, for example, tantalum nitride (TaN), and the liner layer is, for example, ruthenium (Ru) or cobalt (Co).

The processing object layer 102 is arranged by a plurality of crystal grains 110. An interface between the crystal grains 110 is called a crystal grain boundary 111. The crystal grain boundary 111 is a type of lattice defect and is formed by disorder in atomic arrangement.

The narrower the width L of the trench 122 is, the harder it is for the crystal grain 110 to grow, and the wider the width L of the trench 122 is, the easier it is for the crystal grain 110 to grow. Therefore, the narrower the width L of the trench 122 is, the easier it is to form the small crystal grain 110, and the wider the width L of the trench 122 is, the easier it is to form large crystal grain 100. That is, the narrower the width L of the trench 122 is, the higher the crystal grain boundary density becomes, and the wider the width L of the trench 122 is, the lower the crystal grain boundary density becomes.

<Arrangement of Processing Unit>

Figure 3:
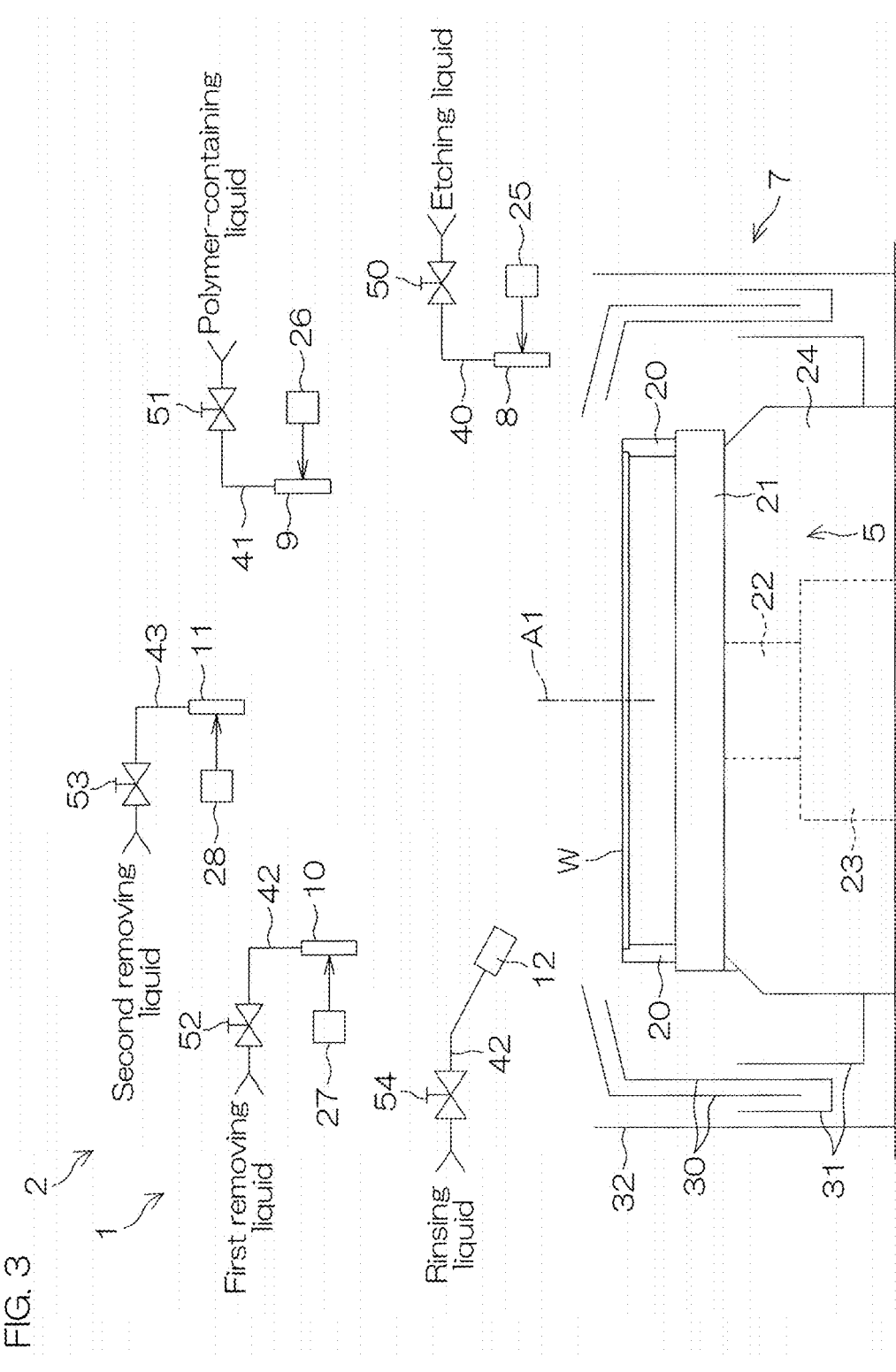
FIG. 3 is a schematic view for describing an arrangement example of a processing unit provided in the substrate processing apparatus.

FIG. 3 is a schematic view for describing an arrangement example of the processing unit 2. The processing unit 2 further includes a spin chuck 5 that rotates the substrate W about a rotation axis A1 while holding the substrate W in a predetermined processing posture, and a plurality of processing liquid nozzles that supply the processing liquids to an upper surface (principal surface on the upper side) of the substrate W held by the spin chuck 5 (an etching liquid nozzle 8, a polymer-containing liquid nozzle 9, a first removing liquid nozzle 10, a second removing liquid nozzle 11, and a rinsing liquid nozzle 12). The spin chuck 5 and the plurality of processing liquid nozzles are disposed in the chamber 4 together with the processing cup 7.

The spin chuck 5 holds the substrate W so that the device surface is the upper surface. The rotation axis A1 passes through a central portion of the substrate W, and is orthogonal to each principal surfaces of the substrate W held in the processing posture. The processing posture is, for example, a posture of the substrate W shown in FIG. 3, which is a horizontal posture where the principal surfaces of the substrate W are horizontal surfaces. In a case where the processing posture is the horizontal posture, the rotation axis A1 extends vertically. The spin chuck 5 is an example of a substrate holding member (substrate holder) that holds the substrate W in the processing posture, and also is an example of a rotation holding member (rotation holder) that rotates the substrate W about the rotation axis A1 while holding the substrate W in the processing posture.

The spin chuck 5 includes a spin base 21 having a disc shape along the horizontal direction, a plurality of gripping pins 20 that grip a peripheral edge portion of the substrate W on the upper side of the spin base 21, a rotation shaft 22 coupled to the spin base 21 and extends in the vertical direction, a rotary driving mechanism 23 that rotates the rotation shaft 22 about the central axis thereof (rotation axis A1), and a housing 24 that houses the rotation shaft 22 and the rotary driving mechanism 23. The spin base 21 is an example of a disc-shaped base.

The plurality of gripping pins 20 are disposed on an upper surface of the spin base 21 while being spaced from each other in the circumferential direction of the spin base 21. The rotary driving mechanism 23 includes, for example, a rotary actuator such as an electric motor. By rotating the rotation shaft 22 by the rotary driving mechanism 23, the spin base 21 and the plurality of gripping pins 20 are rotated about the rotation axis A1. Thereby, the substrate W is rotated about the rotation axis A1 together with the spin base 21 and the plurality of gripping pins 20.

The plurality of gripping pins 20 are movable between a closed position to be brought into contact with the peripheral edge portion of the substrate W and grip the substrate W, and an open position to cancel gripping of the substrate W. The plurality of gripping pins 20 are moved by an opening and closing mechanism (not shown).

When placed at the closed position, the plurality of gripping pins 20 grip the peripheral edge portion of the substrate W and hold the substrate W in the processing posture. When placed at the open position, the plurality of gripping pins 20 cancel the gripping of the substrate W while supporting the peripheral edge portion of the substrate W from the lower side. The opening and closing mechanism includes, for example, a link mechanism and an actuator that applies a driving force to the link mechanism.

The processing cup 7 receives the liquid scattering from the substrate W which is held by the spin chuck 5. The processing cup 7 includes a plurality of (in the example of FIG. 3, two) guards 30 that receive the liquid scattering outward from the substrate W which is held by the spin chuck 5, a plurality of (in the example of FIG. 3, two) cups 31 that receive the liquid guided downward by the plurality of guards 30, and a cylindrical outer wall members 32 surrounding the plurality of guards 30 and the plurality of cups 31.

The plurality of guards 30 are individually elevated and lowered by a guard elevating and lowering mechanism (not shown). Each of the guards 30 can be moved to an upper position at which an upper end thereof is placed on the upper side of the upper surface (principal surface on the upper side) of the substrate W, a lower position at which the upper end thereof is placed on the lower side of the upper surface of the substrate W, and an arbitrary position between the upper position and the lower position.

The plurality of processing liquid nozzles include the etching liquid nozzle 8 that discharges a continuous flow of the etching liquid toward the upper surface of the substrate W held by the spin chuck 5, the polymer-containing liquid nozzle 9 that discharges a continuous flow of the polymer-containing liquid toward the upper surface of the substrate W held by the spin chuck 5, the first removing liquid nozzle 10 that discharges a continuous flow of the first removing liquid toward the upper surface of the substrate W held by the spin chuck 5, the second removing liquid nozzle 11 that discharges a continuous flow of the second removing liquid toward the upper surface of the substrate W held by the spin chuck 5, and the rinsing liquid nozzle 12 that discharges a continuous flow of the rinsing liquid toward the upper surface of the substrate W held by the spin chuck 5.

The etching liquid is, for example, hydrofluoric acid (HF). Hydrofluoric acid may be, for example, heated to not less than 40° C. and not more than 70° C., or heated to not less than 50° C. and not more than 60° C. However, hydrofluoric acid is not necessarily heated. Hydrofluoric acid is an aqueous solution of hydrogen fluoride.

The etching liquid is not restricted to hydrofluoric acid but includes any of hydrofluoric acid, phosphoric acid aqueous solution, hydrogen peroxide solution, APM liquid (ammonia-hydrogen peroxide mixture), HPM liquid (hydrochloric acid-hydrogen peroxide mixture), or aqua regia (mixture of concentrated hydrochloric acid and concentrated nitric acid). All of these are water-soluble etching liquids. Hydrofluoric acid, phosphoric acid aqueous solution, hydrogen peroxide solution, HPM liquid, aqua regia, etc., are acidic etching liquids. APM liquid, etc., are alkaline etching liquids.

The polymer-containing liquid is a liquid containing a solvent and polymer (solute). The polymer contained in the polymer-containing liquid is water-insoluble polymer or water-soluble polymer. The water-soluble polymer includes, for example, alkali soluble polymer not dissolved in acid but dissolved in alkali, and acid soluble polymer not dissolved in alkali but dissolved in acid.

The polymer includes, for example, thermosensitive water-soluble resin. The thermosensitive water-soluble resin is resin which is poorly soluble or insoluble in water before being heated to not less than a predetermined transformation temperature, the resin having a property of being transformed by heating to not less than the transformation temperature to be water-soluble.

As the thermosensitive water-soluble resin, for example, it is possible to use resin, etc., that is decomposed by being heated to not less than the predetermined transformation temperature (for example, not less than 200° C.), exposes a polar functional group, and exerts water-solubility. When heating to not less than the transformation temperature, the thermosensitive water-soluble resin is transformed to be water-soluble.

As the polymer, it is also possible to use a polymer other than the thermosensitive water-soluble resin. As the polymer, it is also possible to use, for example, acrylic resin, phenol resin, epoxy resin, melamine resin, urea resin, unsaturated polyester resin, alkyd resin, polyurethane, polyimide, polyethylene, polypropylene, polyvinyl chloride, polystyrene, polyvinyl acetate, polytetrafluoroethylene, acrylonitrile-butadiene-styrene resin, acrylonitrile styrene resin, polyamide, polyacetal, polycarbonate, polyvinyl alcohol, modified polyphenylene ether, terephthalate, polybutylene polyethylene terephthalate, polyphenylene sulfide, polysulfone, polyetheretherketone, and polyamide imide, etc. For example, polystyrene is an example of the water-insoluble polymer, and phenol resin is an example of the alkali soluble polymer.

The solvent contained in the polymer-containing liquid is an aquatic solvent, an organic solvent, or a mixture of these. The aquatic solvent is, for example, water such as pure water. The pure water is, for example, DIW (deionized water).

The organic solvent includes, for example, at least one of aliphatic hydrocarbon, aromatic hydrocarbon, ester, alcohol, and ether.

Specifically, the organic solvent includes at least one type selected from methanol, ethanol, IPA (isopropyl alcohol), butanol, ethylene glycol, propylene glycol, NMP (N-methyl-2-pyrrolidone), DMF (N, N-dimethylformamide), DMA (dimethyl acetamide), DMSO (dimethyl sulfoxide), hexane, toluene, PGMEA (propylene glycol monomethyl ether acetate), PGME (propylene glycol monomethyl ether), PGPE (propylene glycol monopropyl ether), PGEE (propylene glycol monoethyl GBL (Y-ether), butyrolactone), acetylacetone, 3-pentanone, 2-heptanone, ethyl lactate, cyclohexanone, dibutyl ether, HFE (hydrofluoroether), ethyl nonafluoroisobutyl ether, ethyl nonafluorobutyl ether, and m-xylene hexafluoride.

By evaporation of at least portion of the solvent from the polymer-containing liquid supplied to the upper surface of the substrate W, the polymer-containing liquid on the substrate W is changed to a semi-solid state or a solid-state polymer layer. The polymer-containing liquid forms the polymer layer by solidifying or hardening.

The semi-solid state is a state where a solid component and a liquid component are mixed, the state where the polymer layer has such viscosity that the polymer layer can maintain a certain shape on the substrate W. The solid-state is a state where a liquid component is not contained and the polymer layer is arranged only by a solid component.

Here, "solidifying" indicates, for example, that solute becomes solid by a force, etc., acting between molecules or between atoms following volatilization of the solvent. "Hardening" indicates, for example, that solute becomes solid by a chemical change such as polymerization or cross-linking. Therefore, "solidifying or hardening" means that solute "becomes solid" by various causes.

The first removing liquid and the second removing liquid are liquids that remove the polymer layer from the upper surface of the substrate W by dissolving the polymer on the substrate W. As the first removing liquid and the second removing liquid, it is possible to use the liquids listed as the solvent contained in the polymer-containing liquid. The first removing liquid may be a liquid other than the liquids listed as the solvent contained in the polymer-containing liquid, and may be an alkaline removing liquid or an acidic removing liquid.

The alkaline removing liquid is, for example, a TMAH liquid (tetramethylammonium hydroxide solution), etc. The acidic removing liquid is, for example, acetic acid, etc.

The second removing liquid may similarly be an alkaline removing liquid or an acidic removing liquid. The second removing liquid is, for example, a liquid selected from the organic solvent, the alkaline removing liquid, and the acidic removing liquid, the liquid containing a chemical species different from the first removing liquid as a removing component that removes the polymer. The second removing liquid may be a liquid selected from the organic solvent, the alkaline removing liquid, and the acidic removing liquid, the liquid containing the same chemical species as the first removing liquid as the removing component; however, in that case, a concentration of the removing component contained in the second removing liquid is preferably different from a concentration of the removing component contained in the first removing liquid.

The rinsing liquid is a liquid that rinses the upper surface of the substrate W and removes the etching liquid, the first removing liquid, the second removing liquid, etc., from the upper surface of the substrate W. The rinsing liquid is, for example, water such as DIW. However, the rinsing liquid is not restricted to DIW. The rinsing liquid may be, for example, carbonated water, electrolyzed ion water, aqueous hydrochloric acid solution of diluted concentration (for example of not less than 1 ppm and not more than 100 ppm), ammonia water of diluted concentration (for example of not less than 1 ppm and not more than 100 ppm), or reduced water (hydrogen water).

In the present embodiment, the rinsing liquid nozzle 12 is a fixed nozzle whose positions in the horizontal direction and the vertical direction are fixed. The processing liquid nozzles excluding the rinsing liquid nozzle 12 are moving nozzles. The plurality of processing liquid nozzles excluding the rinsing liquid nozzle 12 are respectively moved in the direction (horizontal direction) along the upper surface of the substrate W by a plurality of nozzle movement mechanisms (a first nozzle movement mechanism 25, a second nozzle movement mechanism 26, a third nozzle movement mechanism 27, and a fourth nozzle movement mechanism 28). Each of the nozzle movement mechanisms can move the corresponding processing liquid nozzle between a central position and a retreat position.

The central position is a position where a discharge port of the processing liquid nozzle opposes the rotation center (central portion) of the upper surface of the substrate W. The retreat position is a position where the discharge port of the processing liquid nozzle does not oppose the upper surface of the substrate W, the position being on the outer side of the processing cup 7.

Each of the nozzle movement mechanisms includes an arm (not shown) that supports the corresponding processing liquid nozzle, and an arm driving mechanism (not shown) that moves the arm in the direction (horizontal direction) along the upper surface of the substrate W. The arm driving mechanism includes an actuator such as an electric motor or an air cylinder.

Each of the processing liquid nozzles may be a turning type nozzle that turns about a predetermined turn axis, or may be a direct-acting type nozzle that linearly moves in the direction in which the arm extends. Each processing liquid nozzle may be arranged so that the processing liquid nozzle can move in the vertical direction as well. The other nozzle movement mechanisms to be described later also have the same arrangement.

Pipings that guide the corresponding processing liquids to the processing liquid nozzles (an etching liquid piping 40, a polymer-containing liquid piping 41, a first removing liquid piping 42, a second removing liquid piping 43, and a rinsing liquid piping 44) are respectively connected to the processing liquid nozzles. Valves that open and close the respective pipings (an etching liquid valve 50, a polymer-containing liquid valve 51, a first removing liquid valve 52, a second removing liquid valve 53, and a rinsing liquid valve 54) are respectively provided in the pipings. When the valve is opened, the continuous flow of the corresponding processing liquid is discharged from the corresponding processing liquid nozzle.

"The etching liquid valve 50 is provided in the etching liquid piping 40" may mean that the etching liquid valve 50 is placed on the etching liquid piping 40. The same applies to the other valves. Although not shown, the etching liquid valve 50 includes a valve body inside which a valve seat is provided, a valve element that opens and closes the valve seat, and an actuator that moves the valve element between an open position and a closed position. The other valves also have the same arrangement.

<Electrical Configuration of Substrate Processing Apparatus>

Figure 4:
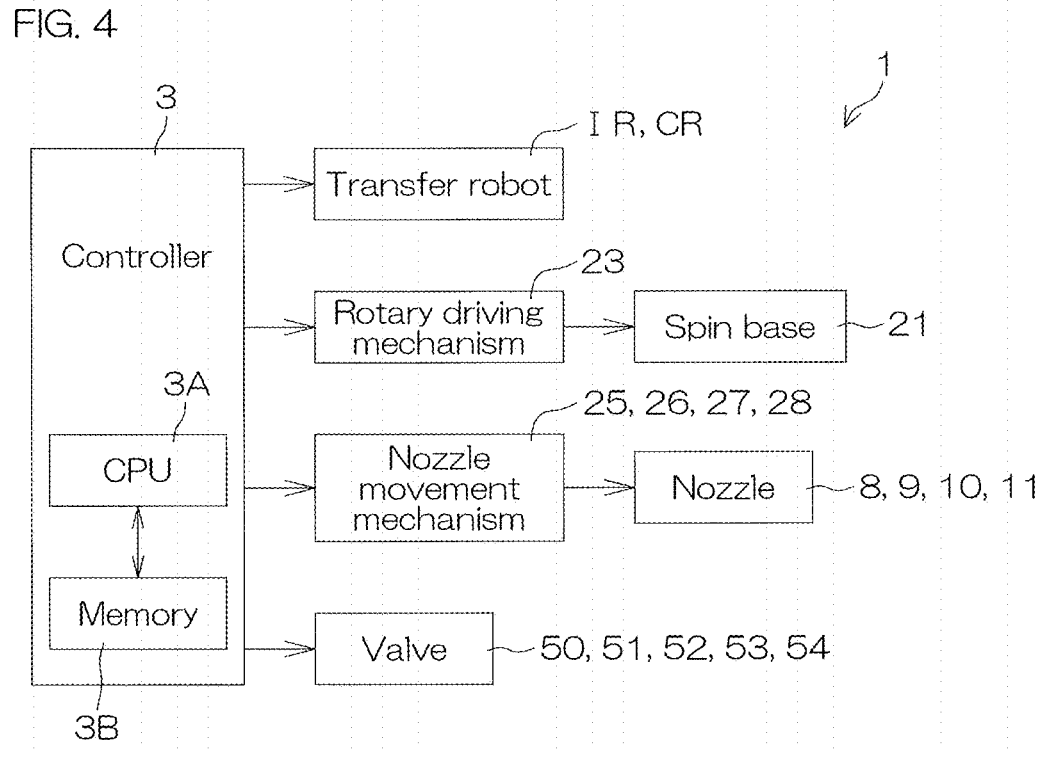
FIG. 4 is a block diagram for describing an electrical configuration example of the substrate processing apparatus.

FIG. 4 is a block diagram for describing an electrical configuration example of the substrate processing apparatus 1. The controller 3 includes a microcomputer and controls objects to be controlled provided in the substrate processing apparatus 1 according to a predetermined control program.

Specifically, the controller 3 includes a processor 3A (CPU), and a memory 3B in which the control program is stored. The controller 3 is arranged to execute various controls for the substrate processing by executing the control program by the processor 3A. In particular, the controller 3 is programmed to control the transfer robots IR and CR, the rotary driving mechanism 23, the first nozzle movement mechanism 25, the second nozzle movement mechanism 26, the third nozzle movement mechanism 27, the fourth nozzle movement mechanism 28, and the valves, etc. The valves include the etching liquid valve 50, the polymer-containing liquid valve 51, the first removing liquid valve 52, the second removing liquid valve 53, and the rinsing liquid valve 54.

By controlling the valve by the controller 3, discharge/non-discharge of the fluid from the corresponding nozzle or a discharge flow rate of the fluid from the corresponding nozzle are controlled. Respective steps shown in FIG. 5 to be described later are executed by controlling the respective members provided in the substrate processing apparatus 1 by the controller 3. In other words, the controller 3 is programmed to execute the respective steps shown in FIG. 5 to be described later.

<First Substrate Processing>

Figure 5:
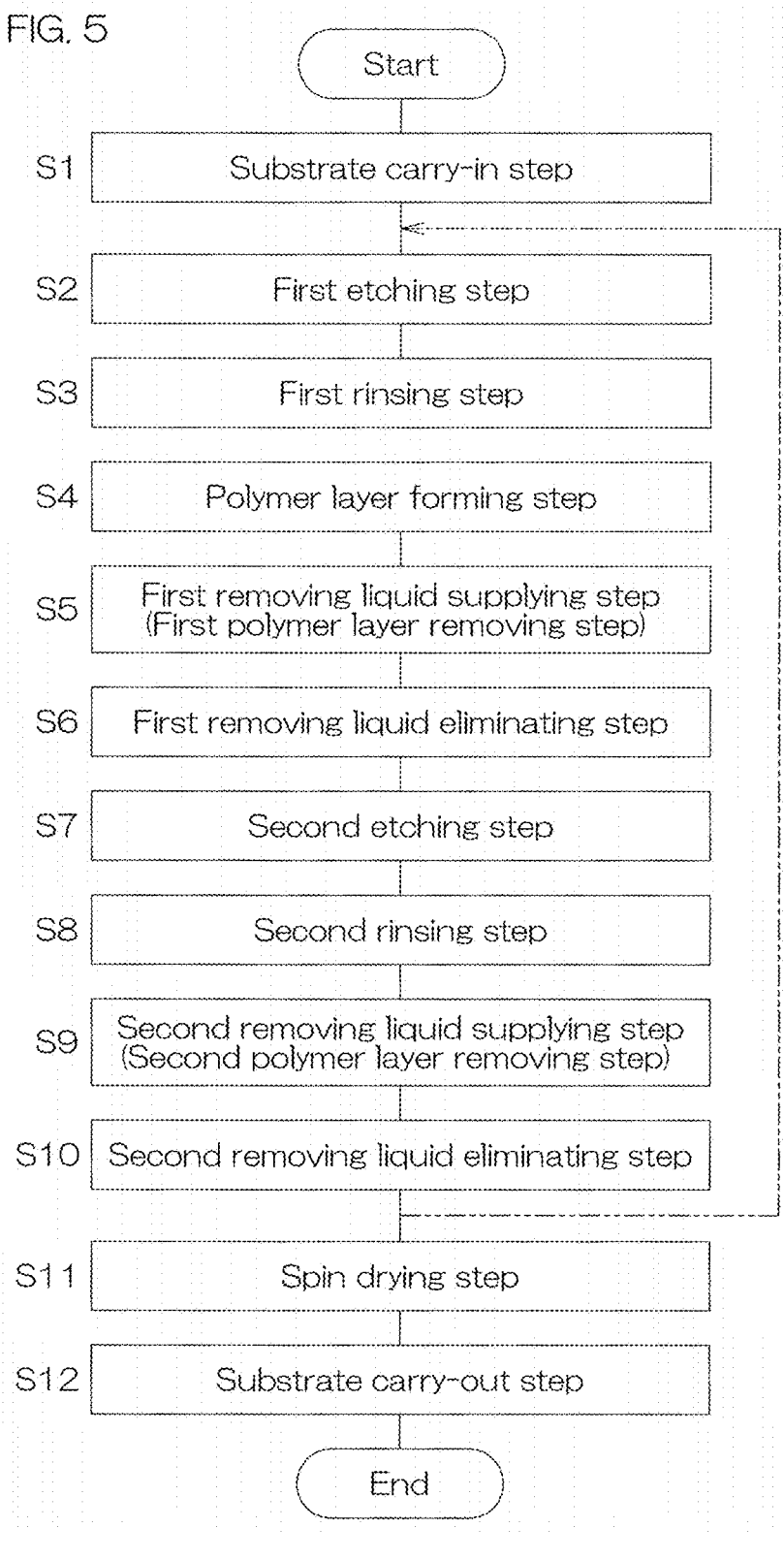
FIG. 5 is a flowchart for describing first substrate processing to be executed by the substrate processing apparatus.
Figure 6A:
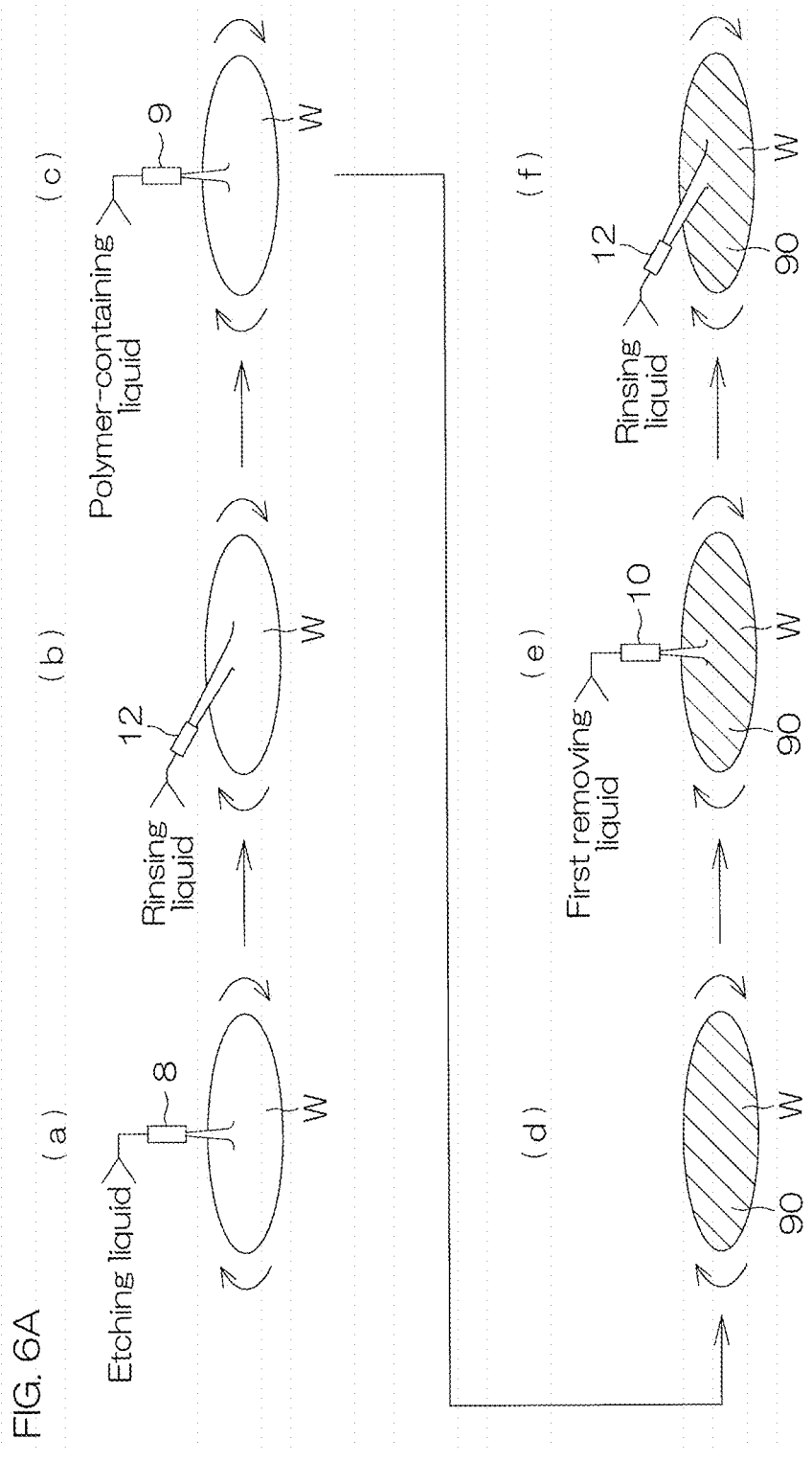
FIG. 6A is a schematic view for describing a state of the upper surface of the substrate during the first substrate processing.
Figure 6B:
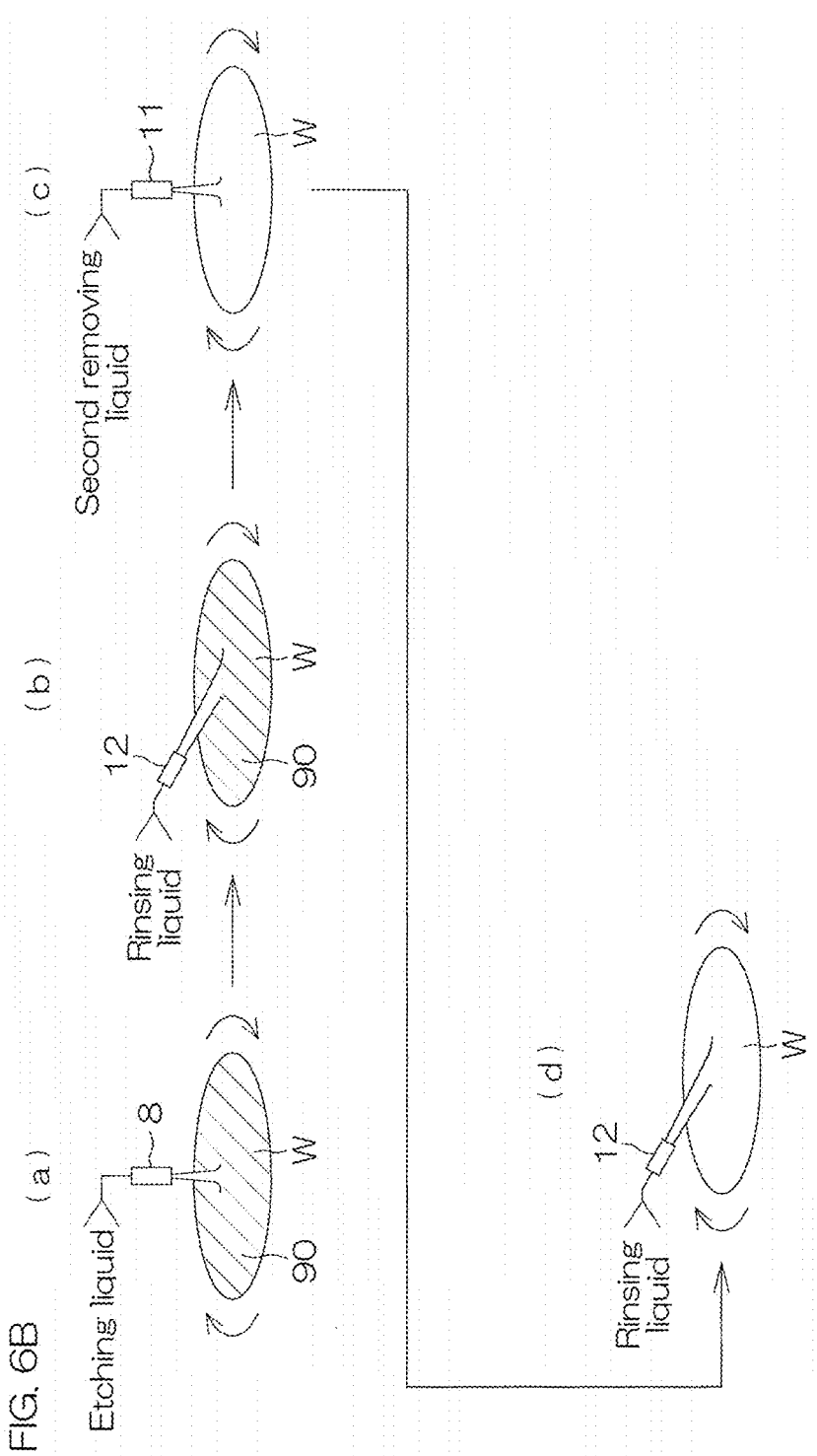
FIG. 6B is a schematic view for describing a state of the upper surface of the substrate during the first substrate processing.

FIG. 5 is a flowchart for describing first substrate processing serving as an example of the substrate processing to be executed by the substrate processing apparatus 1. FIG. 5 mainly shows the processing to be realized by executing the program by the controller 3. FIGS. 6A and 6B are schematic views describing states of the upper surface of the substrate W during the first substrate processing.

In the substrate processing by the substrate processing apparatus 1, for example, as shown in FIG. 5, a substrate carry-in step (Step S1), a first etching step (Step S2), a first rinsing step (Step S3), a polymer layer forming step (Step S4), a first removing liquid supplying step (Step S5), a first removing liquid eliminating step (Step S6), a second etching step (Step S7), a second rinsing step (Step S8), a second removing liquid supplying step (Step S9), a second removing liquid eliminating step (Step S10), a spin drying step (Step S11), and a substrate carry-out step (Step S12) are executed.

In the first substrate processing, as the polymer, a polymer that is hardly dissolved in the etching liquid is selected. Therefore, in the first substrate processing, the polymer contained in the polymer-containing liquid, the etching liquid, the first removing liquid, and the second removing liquid are used in the following combinations.

When the polymer contained in the polymer-containing liquid is the water-insoluble polymer, as the etching liquid, for example, a water-soluble etching liquid such as hydrofluoric acid is used, and as the first removing liquid and the second removing liquid, for example, an organic solvent such as IPA, toluene is used.

When the polymer contained in the polymer-containing liquid is the acid soluble polymer, as the etching liquid, for example, an alkaline etching liquid such as TMAH liquid is used, and as the first removing liquid and the second removing liquid, for example, an acidic removing liquid such as hydrofluoric acid is used.

When the polymer contained in the polymer-containing liquid is the alkali soluble polymer, as the etching liquid, for example, an acidic etching liquid such as hydrofluoric acid is used, and as the first removing liquid and the second removing liquid, for example, an alkaline removing liquid such as TMAH liquid is used.

Hereinafter, details of the first substrate processing will be described mainly with reference to FIGS. 3 and 5, and appropriately with reference to FIGS. 6A and 6B.

First, the not-yet-processed substrate W is carried into the processing unit 2 from the carrier C by the transfer robot CR (see FIG. 1), and handed over to the spin chuck 5 (carry-in step: Step S1). Thereby, the substrate W is held in the processing posture by the spin chuck 5 (substrate holding step). At this time, the substrate W is held by the spin chuck 5 so that the device surface is the upper surface. The spin chuck 5 starts rotation of the substrate W while holding the substrate W (substrate rotating step).

First, the first etching step (Step S2) of supplying the etching liquid to the upper surface of the substrate W is executed. Specifically, the first nozzle movement mechanism 25 moves the etching liquid nozzle 8 to a processing position. The processing position is, for example, a central position. In a state where the etching liquid nozzle 8 is placed at the processing position, the etching liquid valve 50 is opened. Thereby, as shown in FIG. 6A (a), the etching liquid is supplied (discharged) from the etching liquid nozzle 8 toward the upper surface of the substrate W (first etching liquid discharging step, first etching liquid supplying step).

The etching liquid discharged from the etching liquid nozzle 8 spreads over the entire upper surface of the substrate W by an action of a centrifugal force due to the rotation of the substrate W. Thereby, the upper surface of the substrate W is processed with the etching liquid. The etching liquid on the upper surface of the substrate W scatters to the outside of the substrate W from a peripheral edge portion of the upper surface of the substrate W. While the etching liquid is being supplied to the upper surface of the substrate W in the first etching step, the substrate W is rotated, for example, at a rotation speed of not less than 10 rpm and not more than 2000 rpm.

After the etching liquid is supplied to the upper surface of the substrate W for a predetermined period (for example, a period of not less than 10 seconds and not more than 120 seconds), the first rinsing step (Step S3) of supplying the rinsing liquid to the upper surface of the substrate W is executed. Specifically, the etching liquid valve 50 is closed, and instead, the rinsing liquid valve 54 is opened. Thereby, as shown in FIG. 6A (b), the rinsing liquid is supplied (discharged) from the rinsing liquid nozzle 12 toward the upper surface of the substrate W (first rinsing liquid discharging step, first rinsing liquid supplying step).

After the etching liquid valve 50 is closed, the first nozzle movement mechanism 25 moves the etching liquid nozzle 8 to the retreat position. Also in the following steps, each of the processing liquid nozzles is disposed at the processing position (central position in the present embodiment) by the corresponding nozzle movement mechanism. By opening the corresponding valve in that state, the processing liquid is discharged toward the upper surface of the substrate W. After the corresponding valve is closed, each nozzle is moved to the retreat position.

The rinsing liquid discharged from the rinsing liquid nozzle 12 spreads over the entire upper surface of the substrate W by the action of the centrifugal force due to the rotation of the substrate W. Thereby, the upper surface of the substrate W is washed away, and the etching liquid is eliminated from the upper surface of the substrate W. The rinsing liquid on the upper surface of the substrate W scatters to the outside of the substrate W from the peripheral edge portion of the upper surface of the substrate W together with the etching liquid. While the rinsing liquid is being supplied to the upper surface of the substrate W in the first rinsing step, the substrate W is rotated, for example, at a rotation speed of not less than 10 rpm and not more than 2000 rpm.

After the rinsing liquid is supplied to the upper surface of the substrate W for a predetermined period (for example, a period of not less than 10 seconds and not more than 60 seconds), the polymer layer forming step (Step S4) of supplying the polymer-containing liquid to the upper surface of the substrate W and forming a polymer layer 90 on the upper surface of the substrate W is executed. Specifically, in a state where the polymer-containing liquid nozzle 9 is disposed at the processing position, the polymer-containing liquid valve 51 is opened. Thereby, as shown in FIG. 6A (c), the polymer-containing liquid is supplied (discharged) from the polymer-containing liquid nozzle 9 toward the upper surface of the substrate W (polymer-containing liquid discharging step, polymer-containing liquid supplying step).

The polymer-containing liquid discharged from the polymer-containing liquid nozzle 9 spreads over the entire upper surface of the substrate W by the action of the centrifugal force due to the rotation of the substrate W. By evaporating the solvent from the polymer-containing liquid on the upper surface of the substrate W, as shown in FIG. 6A (d), formation of the polymer layer 90 is facilitated (polymer layer formation facilitating step).

Specifically, after the polymer-containing liquid is supplied to the upper surface of the substrate W for a predetermined period (for example, a period of not less than 10 seconds and not more than 120 seconds), the polymer-containing liquid valve 51 is closed and discharge of the polymer-containing liquid from the polymer-containing liquid nozzle 9 is stopped. As shown in FIG. 6A (d), even after the discharge of the polymer-containing liquid is stopped, the rotation of the substrate W is continued. At this time, the rotation of the substrate W may be accelerated. After the discharge of the polymer-containing liquid from the polymer-containing liquid nozzle 9 is stopped, the rotation speed of the substrate W is made to be, for example, not less than 10 rpm and not more than 2000 rpm.

By rotating the substrate W for a predetermined period (for example, a period of not less than 10 seconds and not more than 120 seconds) in a state where the discharge of the polymer-containing liquid from the polymer-containing liquid nozzle 9 is stopped, an amount of the polymer-containing liquid on the upper surface of the substrate W is reduced. That is, a liquid film of the polymer-containing liquid is thinned (film thinning step). At the same time, by the action of the centrifugal force due to the rotation of the substrate W, vapor of the solvent is eliminated from an atmosphere in contact with the upper surface of the substrate W. Thereby, evaporation of the solvent from the polymer-containing liquid on the upper surface of the substrate W is facilitated.

After the substrate W is rotated for a predetermined period (for example, a period of not less than 10 seconds and not more than 120 seconds), a first removing liquid supplying step (Step S5) of supplying the first removing liquid to the upper surface of the substrate W is executed. Specifically, in a state where the first removing liquid nozzle 10 is disposed at the processing position, the first removing liquid valve 52 is opened. Thereby, as shown in FIG. 6A (e), the first removing liquid is supplied (discharged) from the first removing liquid nozzle 10 toward the upper surface of the substrate W (first removing liquid discharging step, first removing liquid supplying step).

The first removing liquid discharged from the first removing liquid nozzle 10 spreads over the entire upper surface of the substrate W by the action of the centrifugal force due to the rotation of the substrate W. Although details will be described later, portion of the polymer layer 90 is thereby removed from the upper surface of the substrate W. The first removing liquid on the upper surface of the substrate W scatters to the outside of the substrate W from the peripheral edge portion of the upper surface of the substrate W. While the first removing liquid is being supplied to the upper surface of the substrate W in the first removing liquid supplying step, the substrate W is rotated, for example, at a rotation speed of not less than 10 rpm and not more than 2000 rpm.

After the first removing liquid is supplied to the upper surface of the substrate W for a predetermined period (for example, a period of not less than 10 seconds and not more than 120 seconds), the first removing liquid eliminating step (Step S6) of supplying the rinsing liquid to the upper surface of the substrate W and eliminating the first removing liquid from the upper surface of the substrate W is executed. Specifically, the first removing liquid valve 52 is closed, and instead, the rinsing liquid valve 54 is opened. Thereby, as shown in FIG. 6A (f), the rinsing liquid is supplied (discharged) from the rinsing liquid nozzle 12 toward the upper surface of the substrate W.

The rinsing liquid discharged from the rinsing liquid nozzle 12 spreads over the entire upper surface of the substrate W by the action of the centrifugal force due to the rotation of the substrate W. Thereby, the upper surface of the substrate W is washed away and the first removing liquid is eliminated from the upper surface of the substrate W. While the rinsing liquid is being supplied to the upper surface of the substrate W in the first removing liquid eliminating step, the substrate W is rotated, for example, at a rotation speed of not less than 20 rpm and not more than 2000 rpm.

After the rinsing liquid is supplied to the upper surface of the substrate W for a predetermined period (for example, a period of not less than 10 seconds and not more than 60 seconds), the second etching step (Step S7) of supplying the etching liquid to the upper surface of the substrate W is executed. Specifically, in a state where the rinsing liquid valve 54 is closed and the etching liquid nozzle 8 is disposed at the processing position, the etching liquid valve 50 is opened. Thereby, as shown in FIG. 6B (a), the etching liquid is supplied (discharged) from the etching liquid nozzle 8 toward the upper surface of the substrate W (second etching liquid discharging step, second etching liquid supplying step).

The etching liquid discharged from the etching liquid nozzle 8 spreads over the entire upper surface of the substrate W by the action of the centrifugal force due to the rotation of the substrate W. Thereby, the upper surface of the substrate W is processed again with the etching liquid. The etching liquid on the upper surface of the substrate W scatters to the outside of the substrate W from the peripheral edge portion of the upper surface of the substrate W. While the etching liquid is being supplied to the upper surface of the substrate W in the second etching step, the substrate W is rotated, for example, at a rotation speed of not less than 10 rpm and not more than 2000 rpm.

After the etching liquid is supplied to the upper surface of the substrate W for a predetermined period (for example, a period of not less than 10 seconds and not more than 120 seconds), the second rinsing step (Step S8) of supplying the rinsing liquid to the upper surface of the substrate W is executed. Specifically, the etching liquid valve 50 is closed, and instead, the rinsing liquid valve 54 is opened. Thereby, as shown in FIG. 6B (b), the rinsing liquid is supplied (discharged) from the rinsing liquid nozzle 12 toward the upper surface of the substrate W (second rinsing liquid discharging step, second rinsing liquid supplying step).

The rinsing liquid discharged from the rinsing liquid nozzle 12 spreads over the entire upper surface of the substrate W by the action of the centrifugal force due to the rotation of the substrate W. Thereby, the upper surface of the substrate W is washed away and the etching liquid is eliminated from the upper surface of the substrate W. The rinsing liquid on the upper surface of the substrate W scatters to the outside of the substrate W from the peripheral edge portion of the upper surface of the substrate W together with the etching liquid. While the rinsing liquid is being supplied to the upper surface of the substrate W in the second rinsing step, the substrate W is rotated, for example, at a rotation speed of not less than 10 rpm and not more than 2000 rpm.

After the rinsing liquid is supplied to the upper surface of the substrate W for a predetermined period (for example, a period of not less than 10 seconds and not more than 60 seconds), the second removing liquid supplying step (Step S9) of supplying the second removing liquid to the upper surface of the substrate W is executed. Specifically, in a state where the rinsing liquid valve 54 is closed and the second removing liquid nozzle 11 is disposed at the processing position, the second removing liquid valve 53 is opened. Thereby, as shown in FIG. 6B (c), the second removing liquid is supplied (discharged) from the second removing liquid nozzle 11 toward the upper surface of the substrate W (second removing liquid discharging step, second removing liquid supplying step).

The second removing liquid discharged from the second removing liquid nozzle 11 spreads over the entire upper surface of the substrate W by the action of the centrifugal force due to the rotation of the substrate W. Although details will be described later, the remaining portion of the polymer layer 90 is thereby removed from the upper surface of the substrate W. The second removing liquid on the upper surface of the substrate W scatters to the outside of the substrate W from the peripheral edge portion of the upper surface of the substrate W. While the second removing liquid is being supplied to the upper surface of the substrate W in the second removing liquid supplying step, the substrate W is rotated, for example, at a rotation speed of not less than 10 rpm and not more than 2000 rpm.

After the second removing liquid is supplied to the upper surface of the substrate W for a predetermined period (for example, a period of not less than 10 seconds and not more than 120 seconds), the second removing liquid eliminating step (Step S10) of supplying the rinsing liquid to the upper surface of the substrate W and eliminating the second removing liquid from the upper surface of the substrate W is executed. Specifically, the second removing liquid valve 53 is closed, and instead, the rinsing liquid valve 54 is opened. Thereby, as shown in FIG. 6B (d), the rinsing liquid is supplied (discharged) from the rinsing liquid nozzle 12 toward the upper surface of the substrate W.

The rinsing liquid discharged from the rinsing liquid nozzle 12 spreads over the entire upper surface of the substrate W by the action of the centrifugal force due to the rotation of the substrate W. Thereby, the upper surface of the substrate W is washed away and the second removing liquid is eliminated from the upper surface of the substrate W. While the rinsing liquid is being supplied to the upper surface of the substrate W in the second removing liquid eliminating step, the substrate W is rotated, for example, at a rotation speed of not less than 10 rpm and not more than 2000 rpm.

Next, the spin drying step (Step S11) of rotating the substrate W at high speed and drying the upper surface of the substrate W is executed. Specifically, the removing liquid valve 54 is closed, and supply of the rinsing liquid to the upper surface of the substrate W is stopped.

Then, the rotary driving mechanism 23 accelerates the rotation of the substrate W, and rotates the substrate W at high speed (for example, 1500 rpm). Thereby, a large centrifugal force acts on the rinsing liquid attached to the substrate W, and the rinsing liquid is shaken off to a periphery of the substrate W.

After the spin drying step (Step S11), the rotary driving mechanism 23 stops the rotation of the substrate W. Thereafter, the transfer robot CR enters the processing unit 2, receives the processed substrate W from the spin chuck 5, and carries out the substrate W to the outside of the processing unit 2 (substrate carry-out step: Step S12). The substrate W is handed over from the transfer robot CR to the transfer robot IR, and housed in the carrier C by the transfer robot IR.

<Change in Surface Layer Portion of Front Surface of Processing Object Layer During First Substrate Processing>

Figure 7:
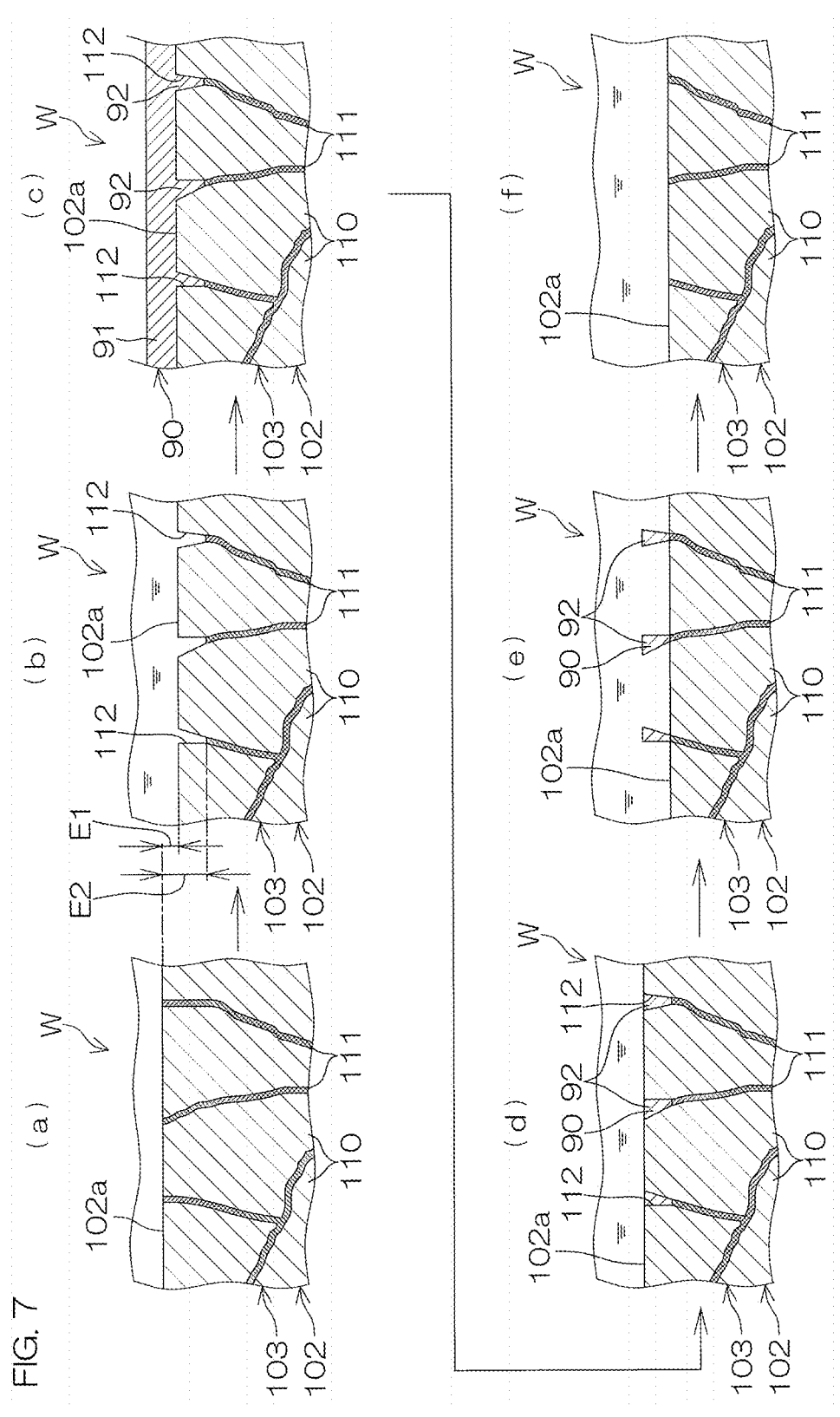
FIG. 7 is a schematic view for describing a change in a surface layer portion of a front surface of a processing object layer during the first substrate processing.

FIG. 7 is a schematic view for describing a change in a surface layer portion 103 of the front surface 102a of the processing object layer 102 during the first substrate processing. The surface layer portion 103 shown in FIG. 7 corresponds to an enlarged view of the surface layer portion of the processing object layer 102 formed in the trench 122 which is shown in FIG. 2.

FIG. 7(a) shows a state of the surface layer portion 103 before the first substrate processing is started. FIG. 7(b) shows a state of the surface layer portion 103 when the first etching step (Step S2) is being executed.

As described above, there is a disorder in atomic arrangement in the crystal grain boundary 111. Therefore, the etching liquid enters the crystal grain boundary 111 more easily than the crystal grains 110. Thus, etching rate with respect to the crystal grain boundary 111 is higher than etching rate with respect to the crystal grains 110. Therefore, by the first etching step, etching with respect to the crystal grain boundary 111 progresses more than etching with respect to the crystal grains 110, a clearance between the crystal grains 110 becomes larger in the crystal grain boundary 111, and a recess portion 112 having such a size that the liquid such as the polymer-containing liquid can enter is formed (recess portion forming step). As shown in FIG. 7(b), an etching amount E2 in the crystal grain boundary 111 of the processing object layer 102 (crystal grain boundary etching amount) is larger than an etching amount E1 in the crystal grains 110 of the processing object layer 102 (crystal grain etching amount). The etching amount is also called as an etching depth.

FIG. 7(c) shows a state of the surface layer portion 103 after the polymer layer forming step (Step S4). By executing the first etching step, the recess portion 112 is formed in the crystal grain boundary 111. Therefore, the polymer-containing liquid supplied to the upper surface of the substrate W in the polymer layer forming step enters the recess portion 112. In the polymer layer forming step, in a state where the polymer-containing liquid enters the recess portion 112 and exists on the processing object layer 102, the polymer-containing liquid is changed to the polymer layer 90. Therefore, a first polymer layer 91 is formed on the processing object layer 102, and a second polymer layer 92 embedded in the crystal grain boundary 111 is formed. The polymer layer 90 includes the first polymer layer 91 and the second polymer layer 92.

FIG. 7(d) shows a state of the surface layer portion 103 when the first removing liquid supplying step (Step S5) is being executed. In the first removing liquid supplying step, while leaving the second polymer layer 92 in the recess portion 112, the first polymer layer 91 is removed (first polymer layer removing step, see FIG. 5). The first polymer layer 91 is removed from the top of the processing object layer 102, for example, by dissolving in the first removing liquid (first polymer layer dissolving step).

For example, removal of the first polymer layer 91 while leaving the second polymer layer 92 is realized by adjusting removing liquids so that a concentration of a removing component in the first removing liquid is lower than a concentration of a removing component in the second removing liquid. Alternatively, the removal of the first polymer layer 91 while leaving the second polymer layer 92 is also realized by using a liquid containing a chemical species whose polymer removing force (dissolving force) is lower than the second removing liquid as a removing component, the liquid serving as the first removing liquid.

In the first substrate processing, the first polymer layer 91 is formed on the processing object layer 102 in the polymer layer forming step, and the first polymer layer 91 is removed while leaving the second polymer layer 92 in the subsequent first removing liquid supplying step. Therefore, there is no need to supply the polymer-containing liquid to the upper surface of the substrate W so that the polymer layer 90 is not formed on the processing object layer 102 and the polymer layer 90 is formed only in the crystal grain boundary 111.

Thus, it is possible to increase the degree of freedom of a method of supplying the polymer-containing liquid.

In addition, it is possible to remove the first polymer layer 91 from the principal surface of the substrate with the first removing liquid before the second etching step. By doing so, even in a case where the polymer layer 90 is not sufficiently removed with the etching liquid, it is possible to expose the processing object layer 102 at the time of starting the second etching step. Therefore, it is possible to swiftly etch the processing object layer 102 in the second etching step.

FIG. 7(e) shows a state of the surface layer portion 103 when the second etching step (Step S7) is being executed.

After the first removing liquid eliminating step, by supplying the etching liquid to the upper surface of the substrate W, it is possible to etch the processing object layer 102 (second etching step).

At the time of supplying the etching liquid to the upper surface of the substrate W in the second etching step, the second polymer layer 92 is embedded in the crystal grain boundary 111. In detail, the second polymer layer 92 is disposed in the recess portion 112. Therefore, it is possible to suppress the etching liquid from entering the crystal grain boundary 111. It is thereby possible to suppress variation of the etching rate due to the entry of the etching liquid to the crystal grain boundary 111. As a result, it is possible to reduce roughness of the front surface 102a of the processing object layer 102 due to a difference between the etching rate with respect to the crystal grains 110 and the etching rate with respect to the crystal grain boundary 111.

By executing the second etching step, the second polymer layer 92 is exposed on the processing object layer 102. It is preferable that the entire second polymer layer 92 is exposed on the processing object layer 102 by executing the second etching step. By exposing the entire second polymer layer 92 on the processing object layer 102, the recess portion 112 of the crystal grain boundary 111 is eliminated, and it is possible to reduce the roughness of the front surface 102a of the processing object layer 102.

FIG. 7(f) shows a state of the surface layer portion 103 when the second removing liquid supplying step (Step S9) is being executed. In the second removing liquid supplying step, the second polymer layer 92 is removed (second polymer layer removing step, see FIG. 5). The second polymer layer 92 is removed from the top of the processing object layer 102, for example, by dissolving in the second removing liquid (second polymer layer dissolving step). It is thereby possible to remove the polymer layer 90 remaining on the front surface 102a of the processing object layer 102 after the processing object layer 102 is etched. Therefore, it is possible to reduce the roughness of the front surface 102a of the processing object layer 102.

As described above, by executing the first substrate processing by using the substrate processing apparatus 1, without oxidizing the surface layer portion 103 of the processing object layer 102, forming an oxidized layer, and then etching the oxidized layer, it is possible to reduce the roughness of the front surface 102a of the processing object layer 102 due to the difference between the etching rate with respect to the crystal grains 110 and the etching rate with respect to the crystal grain boundary 111. That is, without forming the oxidized layer, it is possible to etch the processing object layer 102 while suppressing deterioration (increase) of the roughness.

In a case where the processing object layer 102 is etched without embedding the polymer layer 90 in the crystal grain boundary 111 unlike the present embodiment, a difference in a crystal grain boundary density in the device surface of the substrate W influences the roughness.

In the device surface of the substrate W, the processing object layer 102 is easily etched at a point where the crystal grain boundary density is large (in the trench 122 having a narrow width L), and the processing object layer is not easily etched at a point where the crystal grain boundary density is small (in the trench 122 having a wide width L). Therefore, in the device surface, the processing object layer 102 is not easily uniformly etched, and the roughness of the upper surface of the substrate W is increased. Thus, when the processing object layer 102 is etched in a state where the polymer layer 90 is embedded in the crystal grain boundary 111 as in the first substrate processing, it is possible to reduce variation of etching of the processing object layer 102 between the trenches 122 due to the crystal grain boundary density. That is, it is possible to reduce the roughness due to the crystal grain boundary density.

It is also possible to execute substrate processing different from the first substrate processing by using the substrate processing apparatus 1. Hereinafter, as substrate processing examples different from the first substrate processing, second substrate processing (see FIGS. 8 to 10) and third substrate processing (see FIGS. 11 to 13) will be described.

<Second Substrate Processing>

The first substrate processing described above is based on the premise that the polymer layer 90 having the first polymer layer 91 which is formed on the processing object layer 102 and the second polymer layer 92 which is embedded in the crystal grain boundary 111 is formed in the polymer layer forming step (Step S4). However, there can be a case where the first polymer layer 91 is not formed in the polymer layer forming step (Step S4). In such a case, the second substrate processing to be described below is preferably executed.

Figure 8:
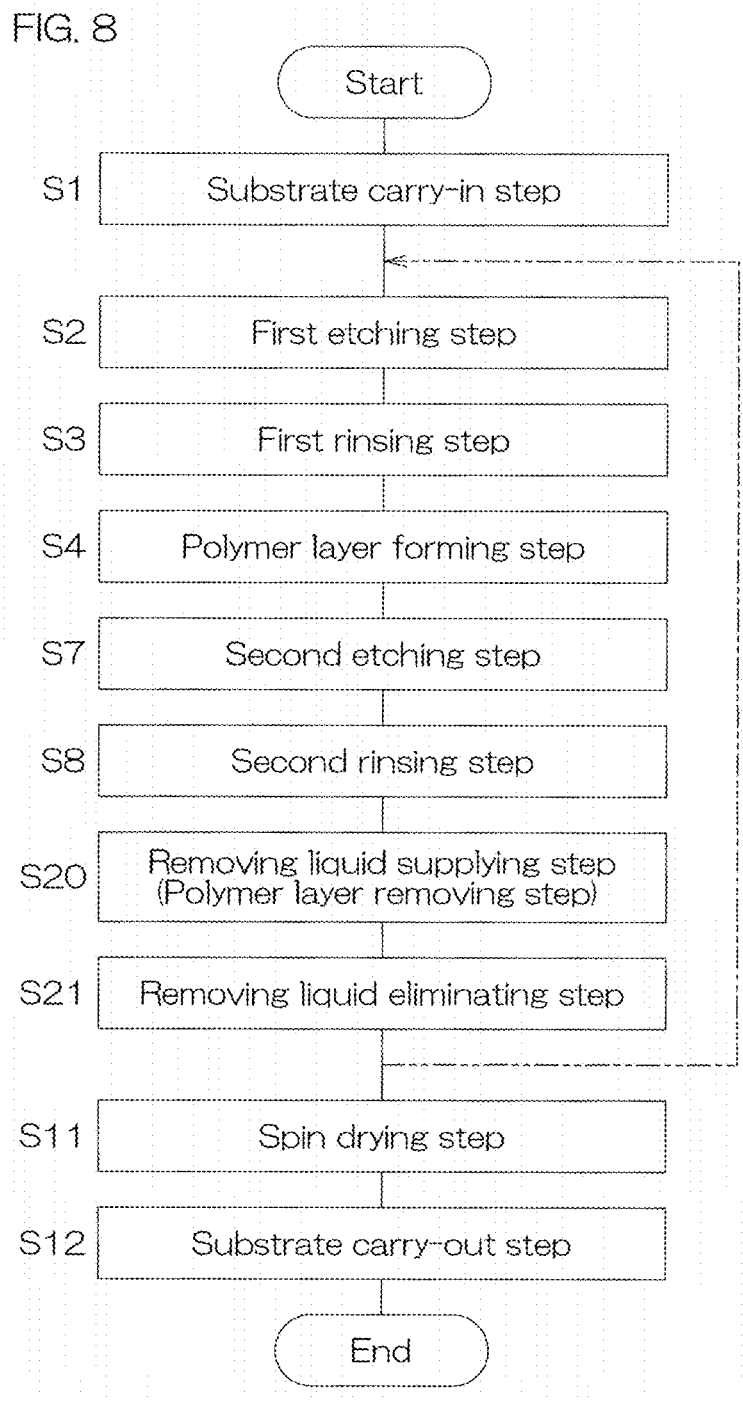
FIG. 8 is a flowchart for describing second substrate processing to be executed by the substrate processing apparatus.
Figure 9:
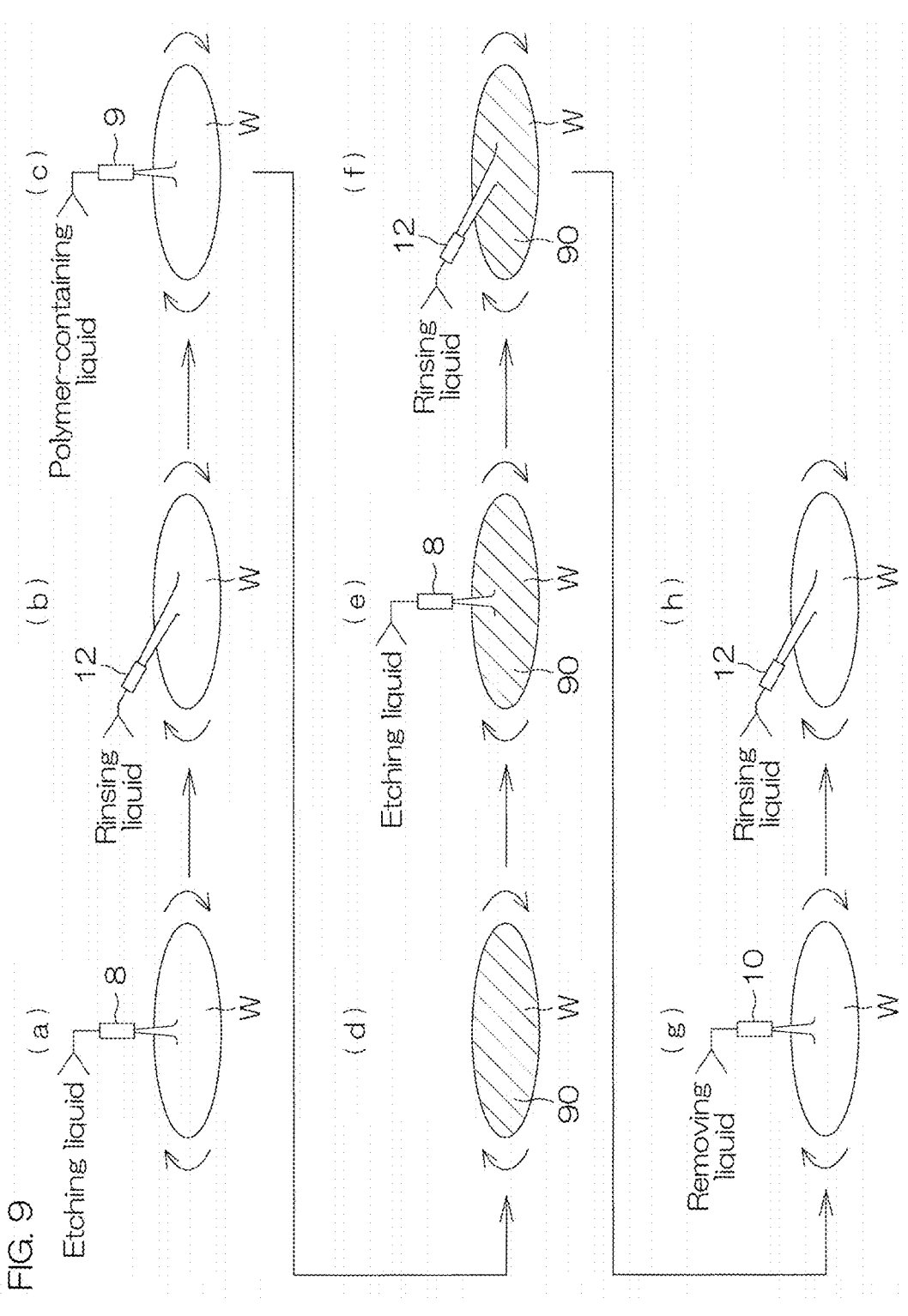
FIG. 9 is a schematic view for describing a state of the upper surface of the substrate during the second substrate processing.

FIG. 8 is a flowchart for describing the second substrate processing. FIG. 8 mainly shows the processing to be realized by executing the program by the controller 3. FIG. 9 is a schematic view for describing a state of the upper surface of the substrate W during the second substrate processing.

The main point of difference between the second substrate processing and the first substrate processing (see FIGS. 5 to 7) is that a removing liquid supplying step (Step S20) and a removing liquid eliminating step (Step S21) are executed instead of the first removing liquid supplying step (Step S5), the first removing liquid eliminating step (Step S6), the second removing liquid supplying step (Step S9), and the second removing liquid eliminating step (Step S10). In the second substrate processing, as the polymer contained in the polymer-containing liquid, a polymer that is hardly dissolved in the etching liquid is selected. Therefore, in the second substrate processing, it is possible to use the same combination as the first substrate processing as a combination of the polymer contained in the polymer-containing liquid, the etching liquid, the second removing liquid serving as the removing liquid.

Hereinafter, the second substrate processing will be described; however, the detailed description of the respective steps is the same as the first substrate processing and thus will be omitted.

In the second substrate processing, after the rotation of the substrate W held by the spin chuck 5 is started, as shown in FIG. 9(a), the first etching step (Step S2) of supplying the etching liquid to the upper surface of the substrate W and processing the upper surface of the substrate W is executed. Thereafter, as shown in FIG. 9(b), the first rinsing step (Step S3) of supplying the rinsing liquid to the upper surface of the substrate W and eliminating the etching liquid from the upper surface of the substrate W is executed.

After the first rinsing step, the polymer layer forming step (Step S4) of forming the polymer layer 90 by supplying the polymer-containing liquid to the upper surface of the substrate W in a rotated state as shown in FIG. 9(c) and then stopping supply of the polymer-containing liquid while continuing the rotated state as shown in FIG. 9(d) is executed.

As shown in FIG. 9(e), in a state where the polymer layer 90 is formed, the second etching step (Step S7) of processing the upper surface of the substrate W by supplying the etching liquid again to the upper surface of the substrate W is executed. Thereafter, as shown in FIG. 9(f), the second rinsing step (Step S8) of supplying the rinsing liquid to the upper surface of the substrate W and eliminating the etching liquid from the upper surface of the substrate W is executed.

Thereafter, as shown in FIG. 9(g), the removing liquid supplying step (Step S20) of supplying the second removing liquid serving as the removing liquid to the upper surface of the substrate W and removing the polymer layer 90 is executed. Further, thereafter, as shown in FIG. 9(h), with the rinsing liquid, the removing liquid eliminating step (Step S21) of eliminating the second removing liquid serving as the removing liquid from the upper surface of the substrate W is executed. Further, thereafter, the spin drying step (Step S11) and the substrate carry-out step (Step S12) are executed.

<Change in Surface Layer Portion of Front Surface of Processing Object Layer During Second Substrate Processing>

Figure 10:
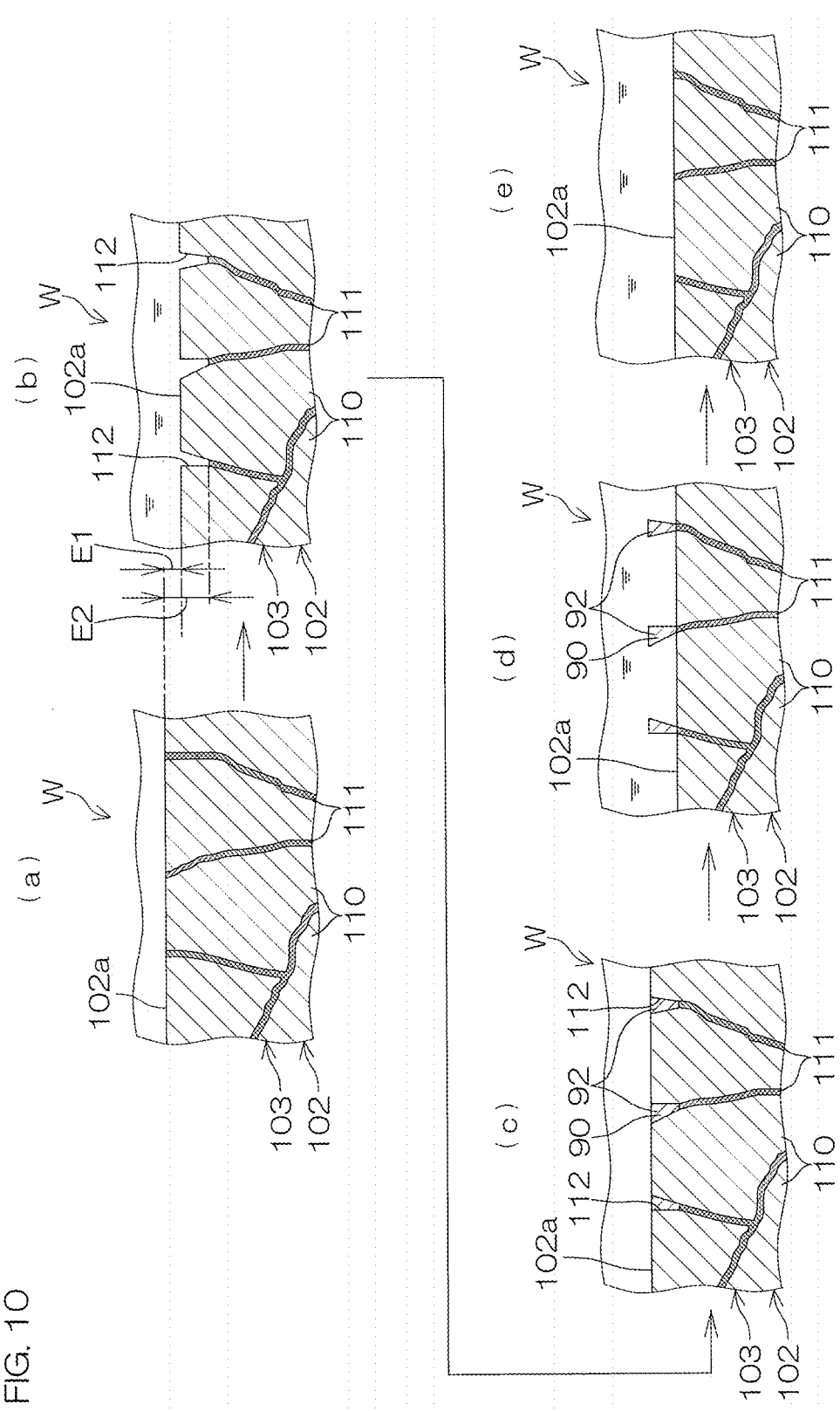
FIG. 10 is a schematic view for describing a change in the surface layer portion of the front surface of the processing object layer during the second substrate processing.

FIG. 10 is a schematic view for describing a change in the surface layer portion 103 of the front surface 102a of the processing object layer 102 during the second substrate processing. The surface layer portion 103 shown in FIG. 10 corresponds to an enlarged view of the surface layer portion of the front surface 102a of the processing object layer 102 formed in the trench 122 which is shown in FIG. 2.

Hereinafter, the change in the surface layer portion 103 of the front surface 102a of the processing object layer 102 in the second substrate processing will be described; however, the description of the same portions as the first substrate processing will be omitted.

FIG. 10(a) shows a state of the surface layer portion 103 before the second substrate processing is started. FIG. 10(b) shows a state of the surface layer portion 103 when the first etching step (Step S2) is being executed. The change in the surface layer portion 103 by execution of the first etching step (Step S2) is the same as the first substrate processing. That is, by the first etching step, etching with respect to the crystal grain boundary 111 progresses more than etching with respect to the crystal grains 110, a clearance between the crystal grains 110 becomes larger in the crystal grain boundary 111, and a recess portion 112 having such a size that the liquid such as the polymer-containing liquid can enter is formed (recess portion forming step). As shown in FIG. 10(b), the etching amount E2 in the crystal grain boundary 111 of the processing object layer 102 (crystal grain boundary etching amount) is larger than the etching amount E1 in the crystal grains 110 of the processing object layer 102 (crystal grain etching amount).

FIG. 10(c) shows a state of the surface layer portion 103 after the polymer layer forming step (Step S4). As described above, in the polymer layer forming step of the second substrate processing, the first polymer layer 91 (see FIG. 7(c)) is not formed. That is, the polymer layer 90 (second polymer layer 92) is formed so that the front surface 102*a* of the processing object layer 102 is exposed and the polymer layer 90 is embedded in the crystal grain boundary 111.

FIG. 10(*d*) shows a state of the surface layer portion 103 when the second etching step (Step S7) is being executed. The change in the surface layer portion 103 by execution of the second etching step is the same as the first substrate processing. It is possible to etch the processing object layer 102 by supplying the etching liquid to the upper surface of the substrate W (second etching step).

At the time of supplying the etching liquid to the upper surface of the substrate W in the second etching step, the second polymer layer 92 is embedded in the crystal grain boundary 111. In detail, the second polymer layer 92 is disposed in the recess portion 112. Therefore, it is possible to suppress the etching liquid from entering the crystal grain boundary 111. It is thereby possible to suppress variation of the etching rate due to the entry of the etching liquid to the crystal grain boundary 111. As a result, it is possible to reduce the roughness of the front surface 102*a* of the processing object layer 102 due to the difference between the etching rate with respect to the crystal grains 110 and the etching rate with respect to the crystal grain boundary 111.

By executing the second etching step, the second polymer layer 92 is exposed on the processing object layer 102. It is preferable that the entire second polymer layer 92 is exposed on the processing object layer 102 by executing the second etching step. By exposing the entire second polymer layer 92 on the processing object layer 102, the recess portion 112 of the crystal grain boundary 111 is eliminated, and it is possible to reduce the roughness of the front surface 102*a* of the processing object layer 102.

FIG. 10(*e*) shows a state of the surface layer portion 103 when the removing liquid supplying step (Step S20) is being executed. The change in the surface layer portion 103 by execution of the removing liquid supplying step is the same as the second removing liquid supplying step (Step S9) in the first substrate processing. That is, in the removing liquid supplying step, the second polymer layer 92 is removed (polymer layer removing step, see FIG. 8). The second polymer layer 92 is removed from the top of the processing object layer 102, for example, by dissolving in the removing liquid (polymer layer dissolving step). It is thereby possible to remove the polymer layer 90 remaining on the front surface 102*a* of the processing object layer 102 after the processing object layer 102 is etched. Therefore, it is possible to reduce the roughness of the front surface 102*a* of the processing object layer 102.

In such a way, even in the second substrate processing, at the time of supplying the etching liquid to the upper surface of the substrate W in the second etching step, the polymer layer 90 (second polymer layer 92) is also embedded in the crystal grain boundary 111. Therefore, it is possible to suppress the etching liquid from entering the crystal grain boundary 111. It is thereby possible to suppress variation of the etching rate due to the entry of the etching liquid to the crystal grain boundary 111.

As a result, it is possible to reduce the roughness of the front surface 102*a* of the processing object layer 102 due to the difference between the etching rate with respect to the crystal grains 110 and the etching rate with respect to the crystal grain boundary 111. In addition, it is also possible to reduce the roughness due to the crystal grain boundary density.

In the second substrate processing, it is possible to omit the first removing liquid supplying step (Step S5) and the first removing liquid eliminating step (Step S6). Therefore, it is possible to shorten the time required for completing the substrate processing.

It is noted that it is possible to execute the second substrate processing using by the substrate processing apparatus 1 shown in FIG. 3. However, it is also possible to execute the second substrate processing by using a substrate processing apparatus made by omitting the first removing liquid nozzle 10 and the members that relate to the nozzle from the substrate processing apparatus 1 shown in FIG. 3.

<Third Substrate Processing>

In a case where polymer to be dissolved in the etching liquid is selected as the polymer contained in the polymer-containing liquid unlike the first substrate processing, it is preferable that the third substrate processing shown below is executed.

In the third substrate processing, the polymer contained in the polymer-containing liquid and the etching liquid are used in the following combinations. When the polymer contained in the polymer-containing liquid is the acid soluble polymer, as the etching liquid, for example, an acidic etching liquid such as hydrofluoric acid, hydrochloric acid, HPM liquid is used. When the polymer contained in the polymer-containing liquid is the alkali soluble polymer, as the etching liquid, for example, an alkaline etching liquid such as ammonia water, TMAH liquid, APM liquid is used.

Further, in the etching liquid used in the third substrate processing, it is preferable that the etching rate with respect to the crystal grains 110 is the same as dissolving rate with respect to the polymer layer 90.

Figure 11:
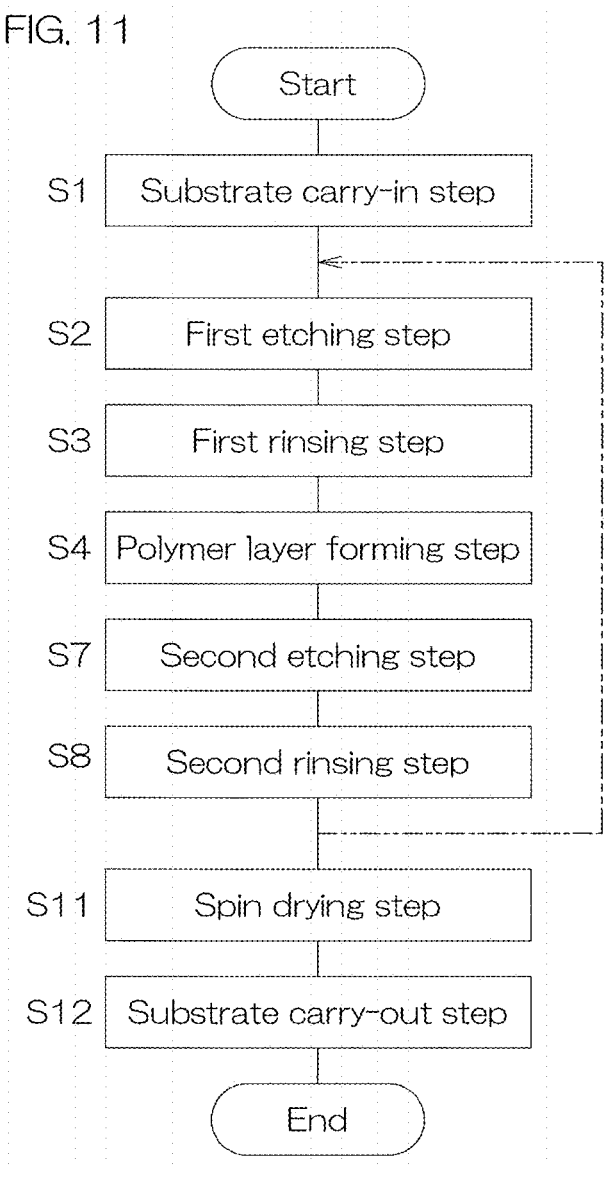
FIG. 11 is a flowchart for describing third substrate processing to be executed by the substrate processing apparatus.
Figure 12:
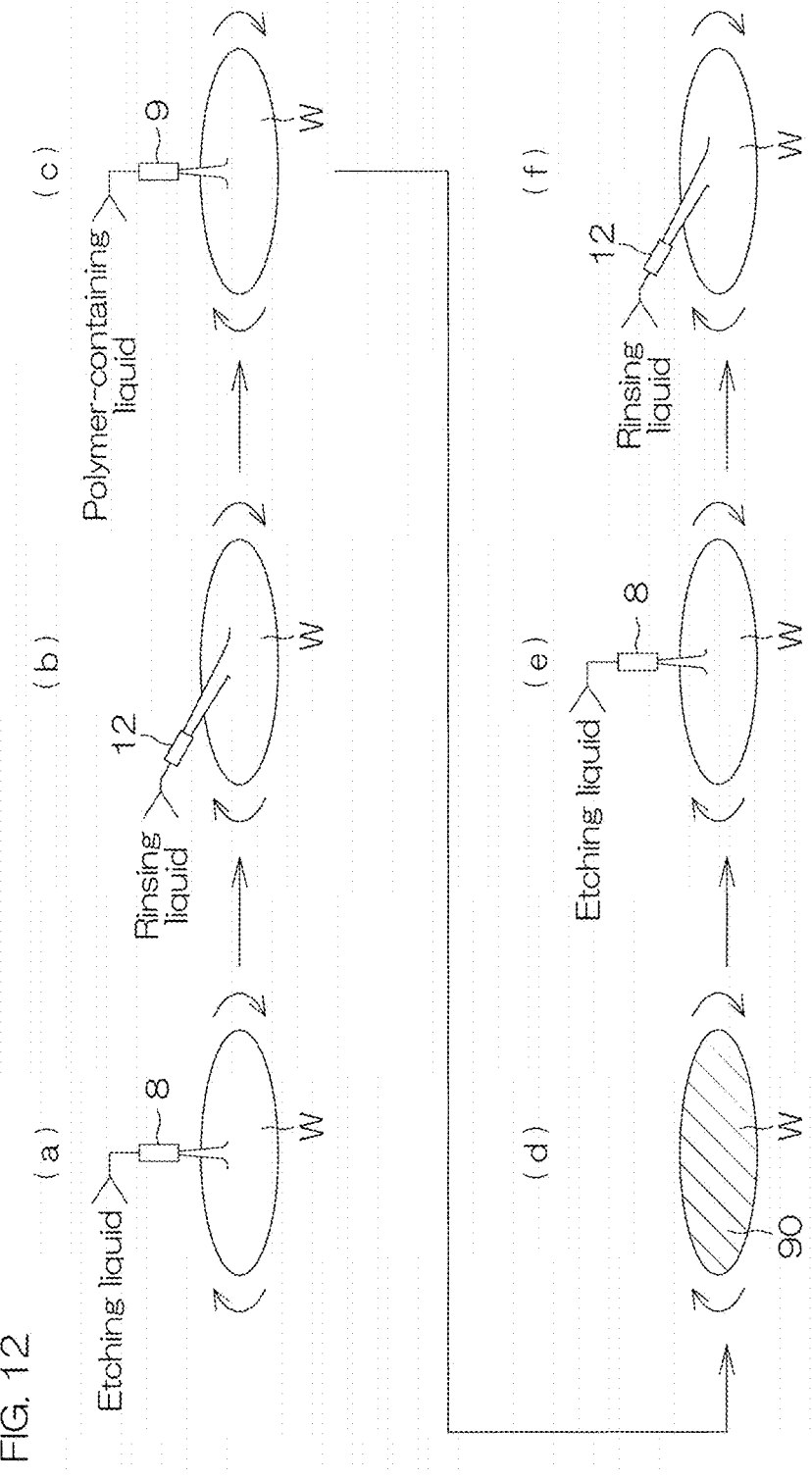
FIG. 12 is a schematic view for describing a state of the upper surface of the substrate during the third substrate processing.

FIG. 11 is a flowchart for describing the third substrate processing. FIG. 11 mainly shows the processing to be realized by executing the program by the controller 3. FIG. 12 is a schematic view for describing a state of the upper surface of the substrate W during the third substrate processing.

The main point of difference between the third substrate processing and the first substrate processing (see FIGS. 5 to 7) is that the first removing liquid supplying step (Step S5), the first removing liquid eliminating step (Step S6), the second removing liquid supplying step (Step S9), and the second removing liquid eliminating step (Step S10) are omitted.

Hereinafter, the third substrate processing will be described; however, the detailed description of the respective steps is the same as the first substrate processing and thus will be omitted.

In the third substrate processing, after the rotation of the substrate W held by the spin chuck 5 is started, as shown in FIG. 12(*a*), the first etching step (Step S2) of supplying the etching liquid to the upper surface of the substrate W and processing the upper surface of the substrate W is executed. Thereafter, as shown in FIG. 12(*b*), the first rinsing step (Step S3) of supplying the rinsing liquid to the upper surface of the substrate W and eliminating the etching liquid from the upper surface of the substrate W is executed.

After the first rinsing step, the polymer layer forming step (Step S4) of forming the polymer layer 90 by supplying the polymer-containing liquid to the upper surface of the substrate W in a rotated state as shown in FIG. 12(*c*) and then stopping supply of the polymer-containing liquid while continuing the rotated state as shown in FIG. 12(*d*) is executed.

As shown in FIG. 12(*e*), in a state where the polymer layer 90 is formed, the second etching step (Step S7) of processing the upper surface of the substrate W by supplying the etching liquid again to the upper surface of the substrate W is executed. Thereafter, as shown in FIG. 12(*f*), the second rinsing step (Step S8) of supplying the rinsing liquid to the upper surface of the substrate W and eliminating the etching liquid from the upper surface of the substrate W is executed. Further, thereafter, the spin drying step (Step S11) and the substrate carry-out step (Step S12) are executed.

<Change in Surface Layer Portion of Front Surface of Processing Object Layer during Third Substrate Processing>

Figure 13:
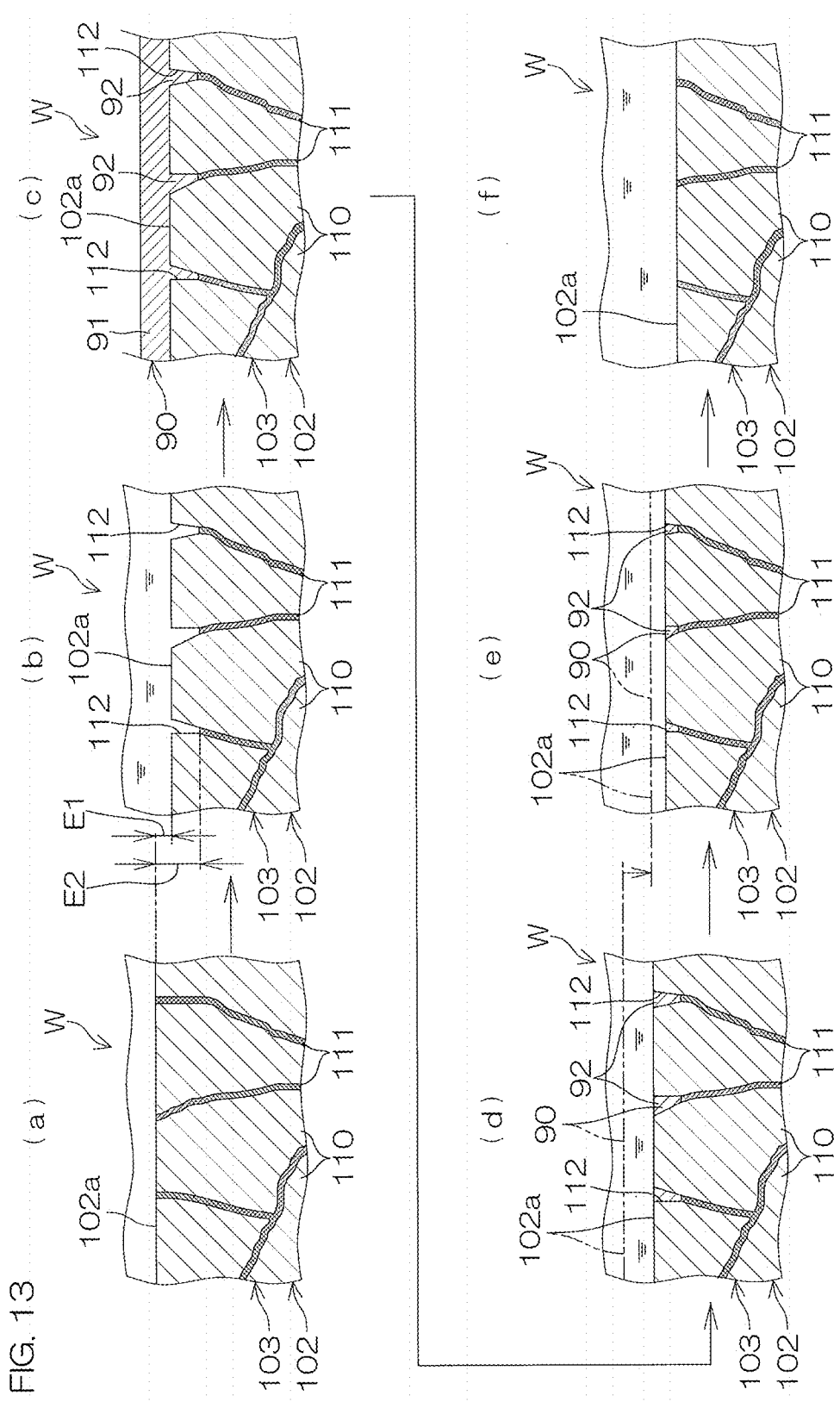
FIG. 13 is a schematic view for describing a change in the surface layer portion of the front surface of the processing object layer during the third substrate processing.

FIG. 13 is a schematic view for describing a change in the surface layer portion 103 of the front surface 102*a* of the processing object layer 102 during the third substrate processing. The surface layer portion 103 shown in FIG. 13 corresponds to an enlarged view of the surface layer portion of the front surface 102*a* of the processing object layer 102 formed in the trench 122 which is shown in FIG. 2.

Hereinafter, the change in the surface layer portion 103 of the front surface 102*a* of the processing object layer 102 in the third substrate processing will be described; however, the description of the same portions as the first substrate processing will be omitted.

FIG. 13(*a*) shows a state of the surface layer portion 103 before the third substrate processing is started. FIG. 13(*b*) shows a state of the surface layer portion 103 when the first etching step (Step S2) is being executed.

The change in the surface layer portion 103 by execution of the first etching step (Step S2) is the same as the first substrate processing. That is, by the first etching step, etching with respect to the crystal grain boundary 111 progresses more than etching with respect to the crystal grains 110, a clearance between the crystal grains 110 becomes larger in the crystal grain boundary 111, and a recess portion 112 having such a size that the liquid such as the polymer-containing liquid can enter is formed (recess portion forming step). As shown in FIG. 13(*b*), the etching amount E2 in the crystal grain boundary 111 of the processing object layer 102 (crystal grain boundary etching amount) is larger than the etching amount E1 in the crystal grains 110 of the processing object layer 102 (crystal grain etching amount).

FIG. 13(*c*) shows a state of the surface layer portion 103 after the polymer layer forming step (Step S4). The change in the surface layer portion 103 by execution of the first etching step (Step S2), the first rinsing step (Step S3), and the polymer layer forming step (Step S4) is the same as the first substrate processing. That is, in the polymer layer forming step, in a state where the polymer-containing liquid enters the recess portion 112 and exists on the processing object layer 102, the polymer-containing liquid is changed to the polymer layer 90. Therefore, the first polymer layer 91 is formed on the processing object layer 102, and the second polymer layer 92 embedded in the crystal grain boundary 111 is formed. The polymer layer 90 includes the first polymer layer 91 and the second polymer layer 92.

FIGS. 13(*d*) to 13(*f*) show states of the surface layer portion 103 when the second etching step (Step S7) is being executed. It is possible to etch the processing object layer 102 by supplying the etching liquid to the upper surface of the substrate W after the polymer layer forming step (second etching step). The polymer contained in the polymer layer 90 has a property of being dissolved with the etching liquid. Therefore, as shown in FIG. 13(*d*), the first polymer layer 91 is dissolved with the etching liquid. Even after the first polymer layer 91 is dissolved and removed from the processing object layer 102, the second polymer layer 92 is embedded in the crystal grain boundary 111. After the first polymer layer 91 is removed, as shown in FIG. 13(*e*), the processing object layer 102 is etched with the etching liquid and also the second polymer layer 92 is dissolved. Finally, as shown in FIG. 13(*f*), the entire second polymer layer 92 is removed and the front surface 102*a* of the processing object layer 102 is evenly smoothed.

At the time of etching the processing object layer 102, the second polymer layer 92 is disposed in the recess portion 112. Therefore, it is possible to suppress the etching liquid from entering the crystal grain boundary 111. It is thereby possible to suppress variation of the etching rate due to the entry of the etching liquid to the crystal grain boundary 111. As a result, it is possible to reduce the roughness of the front surface 102*a* of the processing object layer 102 due to the difference between the etching rate with respect to the crystal grains 110 and the etching rate with respect to the crystal grain boundary 111. In addition, it is also possible to reduce the roughness due to the crystal grain boundary density.

It is noted that in the polymer layer forming step (Step S4) of the third substrate processing, the first polymer layer 91 (see FIG. 13(*c*)) is not necessarily formed. That is, the polymer layer 90 (second polymer layer 92) may be formed so that the front surface 102*a* of the processing object layer 102 is exposed and the polymer layer 90 is embedded in the crystal grain boundary 111.

It is noted that it is possible to execute the third substrate processing by using the substrate processing apparatus 1 shown in FIG. 3. However, it is also possible to execute the third substrate processing by using a substrate processing apparatus made by omitting the first removing liquid nozzle 10, the second removing liquid nozzle 11, the members that relate to the nozzles from the substrate processing apparatus 1 shown in FIG. 3.

As described in the first substrate processing to the third substrate processing, in the polymer layer forming step, the polymer layer 90 at least portion of which is embedded in the crystal grain boundary 111 is formed.

OTHER EMBODIMENTS

The present invention is not restricted to the embodiments described above and can be implemented in yet other modes.

(1) For example, in the embodiment described above, the substrate processing is executed with respect to the upper surface of the substrate W. However, the substrate processing may be executed with respect to a lower surface of the substrate W. In that case, the substrate W is held by the spin chuck 5 so that the device surface is the lower surface.

(2) In each embodiment described above, the spin chuck 5 is a gripping type spin chuck by which a peripheral edge of the substrate W is gripped by the plurality of gripping pins 20; however, the spin chuck 5 is not restricted to the gripping type spin chuck. For example, the spin chuck 5 may be a vacuum adsorption type spin chuck that adsorbs the substrate W onto the spin base 21. In addition, the substrate holding member does not necessarily rotate the substrate W but may be arranged so that the substrate holding member holds the substrate W in the processing posture (for example, the horizontal posture).

(3) The processing posture is not necessarily the horizontal posture. That is, unlike FIG. 3, the processing posture may be held in a vertical posture or may be a posture in which the principal surface of the substrate W is inclined with respect to a horizontal plane.

(4) In each of the substrate processing described above, the first etching step (Step S2), the polymer layer forming step (Step S4), and the second etching step (Step S7) are executed once each. However, unlike each of the substrate processing described above, cycle processing having the first etching step (Step S2), the polymer layer forming step (Step S4), and the second etching step (Step S7) as one cycle may be further executed once or more.

Specifically, in the first substrate processing, as shown by an alternate long and two short dashed line in FIG. 5, cycle processing having the steps from the first etching step (Step S2) to the second removing liquid eliminating step (Step S10) as one cycle is further executed once or more. In the second substrate processing, as shown by an alternate long and two short dashed line in FIG. 8, cycle processing having the steps from the first etching step (Step S2) to the removing liquid eliminating step (Step S21) as one cycle is further executed once or more. In the third substrate processing, as shown by an alternate long and two short dashed line in FIG. 11, cycle processing having the steps from the first etching step (Step S2) to the second rinsing step (Step S8) as one cycle is further executed once or more.

Even when a thickness of the processing object layer 102 etched by executing the first etching step, the polymer layer forming step, and the second etching step once each is insufficient, it is possible to achieve a desired etching amount by executing the cycle processing multiple times. Therefore, while reducing the roughness of the front surface 102a of the processing object layer 102 due to the difference between the etching rate with respect to the crystal grains 110 and the etching rate with respect to the crystal grain boundary 111, it is possible to achieve the desired etching amount.

(5) In the first substrate processing (see FIGS. 5 to 7) and the second substrate processing (see FIGS. 8 to 10), respectively, it is possible to omit the second removing liquid eliminating step (Step S10) and the removing liquid eliminating step (Step S21). In detail, in a case where the second removing liquid (removing liquid) is the aquatic solvent or the organic solvent, there is no need for subsequent elimination of the second removing liquid (removing liquid) with the rinsing liquid.

(6) Even in a case where a polymer that is hardly dissolved with respect to the etching liquid is selected as the polymer contained in the polymer-containing liquid, in the first substrate processing (see FIGS. 5 to 7), it is possible to omit the second removing liquid supplying step (Step S9) and the second removing liquid eliminating step (Step S10).

In detail, when the second polymer layer 92 is removed in the second etching step (Step S7) and the second rinsing step (Step S8) executed before the second removing liquid supplying step (Step S9), it is possible to omit the second removing liquid supplying step. Specifically, it is conceivable that the second polymer layer 92 is removed by kinetic energy acting from a liquid flow of the etching liquid or the rinsing liquid. When the second removing liquid supplying step (Step S9) is omitted, the second removing liquid eliminating step (Step S10) is not required as a matter of course.

Similarly, even in a case where a polymer that is hardly dissolved with respect to the etching liquid is selected as the polymer contained in the polymer-containing liquid, in the second substrate processing (see FIGS. 8 to 10), it is possible to omit the removing liquid supplying step (Step S20) and the removing liquid eliminating step (Step S21).

In detail, when the second polymer layer 92 is removed in the second etching step (Step S7) and the second rinsing step (Step S8) executed before the removing liquid supplying step (Step S20), it is possible to omit the removing liquid supplying step (Step S20). When the removing liquid supplying step (Step S20) is omitted, the removing liquid eliminating step (Step S21) is not required as a matter of course. Specifically, it is conceivable that the second polymer layer 92 is removed by the kinetic energy acting from the liquid flow of the etching liquid or the rinsing liquid.

That is, even in a case where the polymer to be dissolved with respect to the etching liquid is selected as the polymer contained in the polymer-containing liquid, it is possible to execute the third substrate processing shown in FIG. 11.

(7) Conversely, even in a case where polymer to be sufficiently dissolved in the etching liquid is selected as the polymer contained in the polymer-containing liquid, the removing liquid supplying step (Step S20) and the removing liquid eliminating step (Step S21) may be executed after the second rinsing step (Step S8). That is, even in a case where the polymer to be dissolved in the etching liquid is selected as the polymer contained in the polymer-containing liquid, it is possible to execute the second substrate processing shown in FIG. 8. By doing so, even in a case where the second polymer layer 92 is not sufficiently removed in the second etching step (Step S7), it is possible to furthermore favorably remove the polymer layer 90 remaining on the front surface 102a of the processing object layer 102. Therefore, it is possible to reduce the roughness of the front surface 102a of the processing object layer 102.

Further, even in a case where the polymer to be dissolved in the etching liquid is selected as the polymer contained in the polymer-containing liquid, the first removing liquid supplying step (Step S5) and the first removing liquid eliminating step (Step S6) may be executed before the second etching step (Step S7). That is, even in a case where the polymer to be dissolved in the etching liquid is selected as the polymer contained in the polymer-containing liquid, it is possible to execute the first substrate processing shown in FIG. 5. By doing so, it is possible to reduce an amount of the polymer layer 90 to be removed with the etching liquid. Therefore, it is possible to suppress a decrease in activity of the etching liquid due to removal of the polymer layer 90, and suppress a decrease in the etching amount of the processing object layer.

(8) In each embodiment described above, the arrangement is that the plurality of processing liquids are respectively discharged from the plurality of processing liquid nozzles. However, the mode of discharging the processing liquids is not restricted to each embodiment described above.

For example, the processing liquids may be discharged from fixed nozzles whose positions are fixed in the chamber 4, or the arrangement may be that all of the processing liquids are discharged from a single nozzle toward the upper surface of the substrate W. More specifically, the rinsing liquid nozzle 12 may be a moving nozzle, and the processing liquid nozzles other than the rinsing liquid nozzle 12 may be fixed nozzles. In addition, the arrangement may be that the plurality of processing liquid nozzles are integrally moved by a single nozzle driving mechanism.

Further, in each embodiment described above, the nozzles are exemplified as the members that discharge the processing liquids; however, the member that discharges each of the processing liquids is not restricted to a nozzle. That is, the member that discharges each processing liquid is only required to be a member that functions as a processing liquid discharging member that discharges a processing liquid.

(9) In addition, unlike the embodiment described above, the polymer layer 90 may be formed on the upper surface of the substrate W by supplying the polymer-containing liquid to the upper surface of the substrate W by application of the polymer-containing liquid. In detail, the polymer-containing liquid may be applied to the upper surface of the substrate W by moving a bar-shaped application member, to which the polymer-containing liquid is attached to a front surface thereof, along the upper surface of the substrate W while bringing the application member into contact with the upper surface of the substrate W.

(10) In each embodiment described above, some of the pipings, the pumps, the valves, the actuators, etc., are omitted in the figures. However, it does not mean that these members do not exist. In fact, these members are provided at proper positions. For example, a flow rate adjusting valve (not shown) that adjusts a flow rate of a processing liquid discharged from a corresponding processing liquid nozzle may be provided in each of the pipings.

(11) In each embodiment described above, the controller 3 controls the entire substrate processing apparatus 1. However, controllers that control the respective members of the substrate processing apparatus 1 may be dispersed at a plurality of points. In addition, the controller 3 is not required to directly control the respective members, and signals output from the controller 3 may be received by slave controllers that control the respective members of the substrate processing apparatus 1.

(12) In addition, in the embodiment described above, the substrate processing apparatus 1 includes the transfer robots IR and CR, the plurality of processing units 2, and the controller 3. However, the substrate processing apparatus 1 may be arranged by a single processing unit 2 and the controller 3, and in this case, the substrate processing apparatus 1 does not have to include the transfer robots. Alternatively, the substrate processing apparatus 1 may be arranged only by a single processing unit 2. In other words, the processing unit 2 may be an example of the substrate processing apparatus.

While the embodiment of the present invention has been described in detail, these are merely specific examples used to clarify the technical content of the present invention, the present invention should not be interpreted as being limited to these specific examples, and the scope of the present invention shall be limited only by the appended claims.

REFERENCE SIGNS LIST

90: polymer layer
91: first polymer layer
92: second polymer layer
102: processing object layer
102a: front surface
110: crystal grain
111: crystal grain boundary
112: recess portion
W: substrate

The invention claimed is:

1. A substrate processing method, comprising:
a first etching step of supplying an etching liquid to a principal surface of a substrate that has the principal surface on which a processing object layer having a plurality of crystal grains is exposed;

a polymer layer forming step of supplying a polymer-containing liquid containing a polymer to the principal surface of the substrate after the first etching step, and forming a polymer layer at least portion of which is embedded in a crystal grain boundary which is a boundary of the crystal grains; and
a second etching step of supplying an etching liquid to the principal surface of the substrate after the polymer layer forming step, and etching the processing object layer.

2. The substrate processing method according to claim 1, wherein the polymer layer forming step includes a step of forming a first polymer layer on the processing object layer, and forming a second polymer layer embedded in the crystal grain boundary.

3. The substrate processing method according to claim 2, further comprising:
a first removing liquid supplying step of supplying a first removing liquid that removes the first polymer layer to the principal surface of the substrate after the polymer layer forming step and before the second etching step.

4. The substrate processing method according to claim 1, wherein the polymer layer forming step includes a step of forming the polymer layer embedded in the crystal grain boundary so that a front surface of the processing object layer is exposed.

5. The substrate processing method according to claim 1, wherein the second etching step includes a step of etching the processing object layer with the etching liquid and also dissolving the polymer layer in the etching liquid.

6. The substrate processing method according to claim 1, further comprising:
a second removing liquid supplying step of supplying a second removing liquid that removes the polymer layer from the principal surface of the substrate after the second etching step.

7. The substrate processing method according to claim 1, wherein the first etching step includes a recess portion forming step of forming a recess portion in which at least portion of the polymer layer is embedded in the crystal grain boundary.

8. The substrate processing method according to claim 1, wherein cycle processing having the first etching step, the polymer layer forming step, and the second etching step as one cycle is further executed once or more after the second etching step.

9. The substrate processing method according to claim 1, further comprising:
a first rinsing step of supplying a rinsing liquid to the principal surface of the substrate after the first etching step and before the polymer layer forming step.

10. The substrate processing method according to claim 9, further comprising:
a second rinsing step of supplying the rinsing liquid to the principal surface of the substrate after the second etching step.

* * * * *